United States Patent
Sunohara et al.

(10) Patent No.: US 8,299,623 B2
(45) Date of Patent: Oct. 30, 2012

(54) SEMICONDUCTOR PACKAGE

(75) Inventors: Masahiro Sunohara, Nagano (JP);
Yuichi Taguchi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 252 days.

(21) Appl. No.: 12/778,182

(22) Filed: May 12, 2010

(65) Prior Publication Data
US 2010/0289155 A1    Nov. 18, 2010

(30) Foreign Application Priority Data
May 15, 2009 (JP) ................. 2009-118201

(51) Int. Cl.
*H01L 23/48* (2006.01)
(52) U.S. Cl. ............. 257/774; 438/667; 257/E23.011
(58) Field of Classification Search .......... 257/774, 257/E23.011, E21.597; 438/667
See application file for complete search history.

(56) References Cited

U.S. PATENT DOCUMENTS

| | | | |
|---|---|---|---|
| 2008/0197491 A1* | 8/2008 | Matsui | 257/737 |
| 2009/0008747 A1 | 1/2009 | Hoshino et al. | |
| 2009/0117738 A1* | 5/2009 | Sakaguchi | 438/672 |

FOREIGN PATENT DOCUMENTS

| | | |
|---|---|---|
| JP | 2008-153340 | 7/2008 |
| JP | 2009-016773 | 1/2009 |

* cited by examiner

*Primary Examiner* — Shaun Campbell
(74) *Attorney, Agent, or Firm* — IPUSA, PLLC

(57) ABSTRACT

A semiconductor package includes a wiring board and a semiconductor device mounted on the wiring board. The semiconductor device includes a semiconductor substrate and a penetration electrode penetrating the semiconductor substrate. A cavity part is formed in the semiconductor substrate to isolate the penetration electrode from the semiconductor substrate. A connection terminal is provided at a position where the connection terminal does not overlap the penetration electrode in a plan view. The connection terminal electrically connects the semiconductor device to the wiring board.

8 Claims, 23 Drawing Sheets

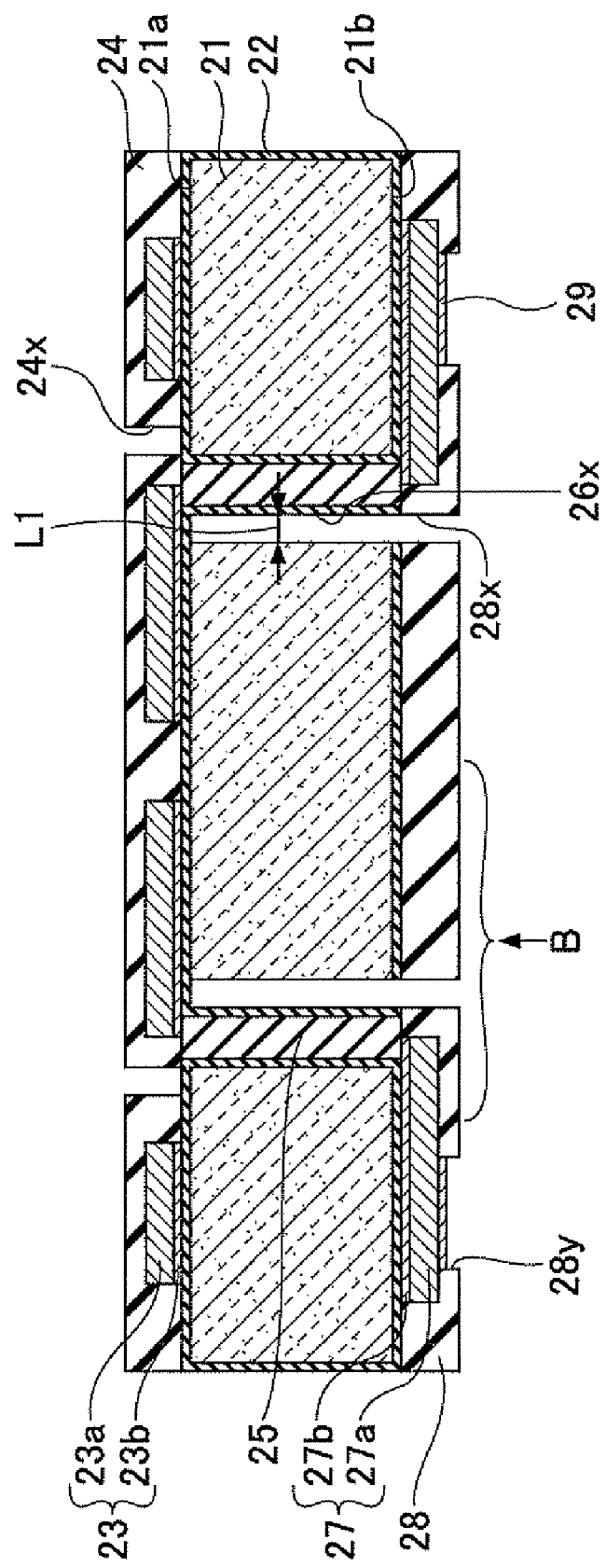

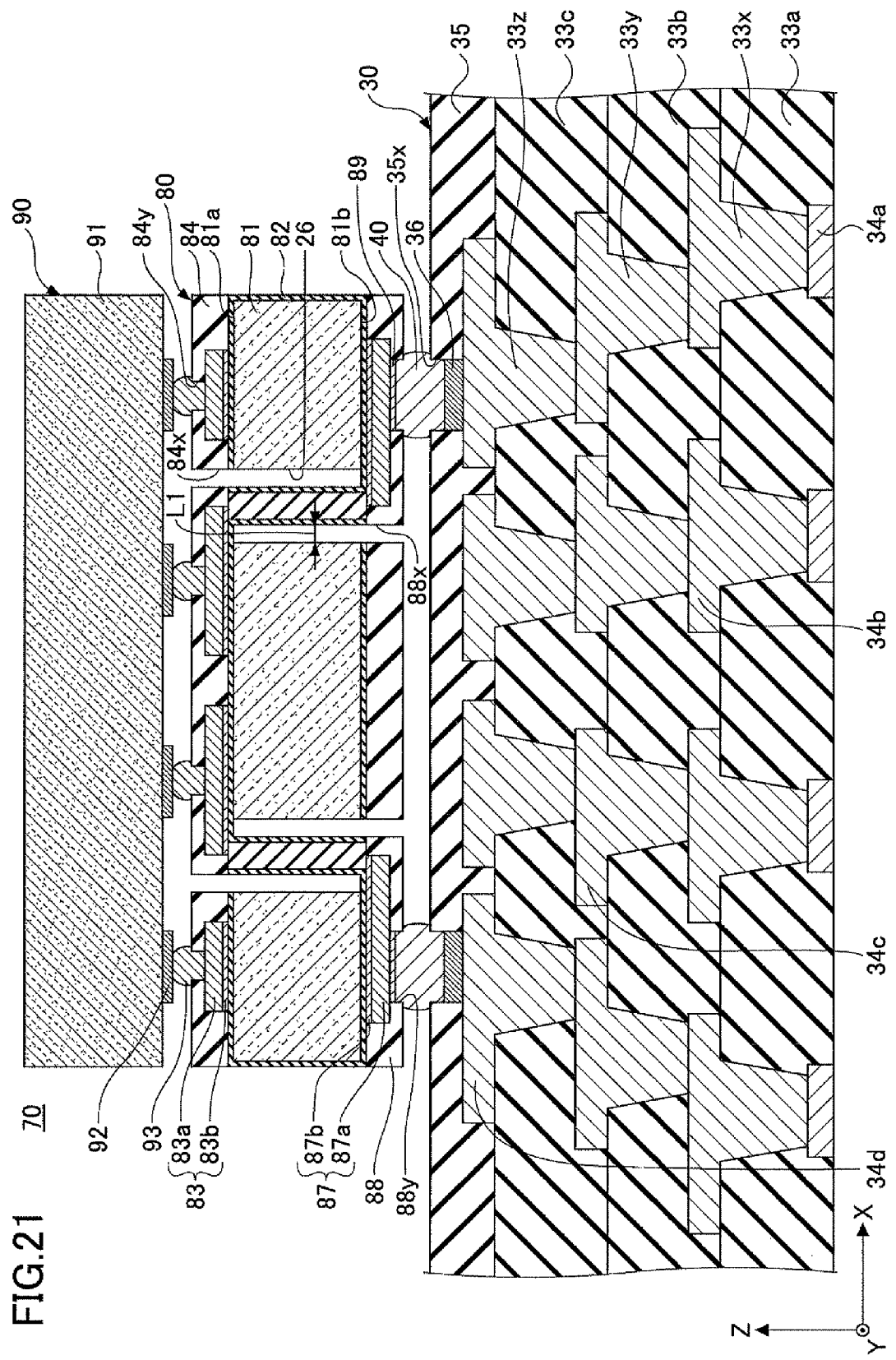

SEMICONDUCTOR PACKAGE

CROSS-REFERENCE TO RELATED APPLICATIONS

This application is based upon and claims the benefit of priority of the prior Japanese Patent Application No. 2009-118201, filed on May 15, 2009, the entire contents of which are incorporated herein by reference.

FIELD

The embodiment discussed herein is directed to a semiconductor package having a semiconductor device and a wiring board.

BACKGROUND

Conventionally, there is known a semiconductor package incorporating a semiconductor device mounted on a wiring board. FIG. 1 is a cross-sectional view illustrating a part of a conventional semiconductor package. With reference to FIG. 1, a semiconductor package 300 has a semiconductor device 400 and a wiring board 500. The semiconductor device 400 has a semiconductor substrate 410, electrode pads 420, and connection terminals 430.

A semiconductor integrated circuit (not illustrated in the figure) or the like is formed on the semiconductor substrate 410. For example, the semiconductor substrate 410 is made of silicon. The connection terminals 430 are formed on the respective electrode pads 420 in order to serve as electrodes. Solder bumps may be used as the connection terminals 430.

The wiring board 500 includes an insulation layer 530, a wiring layer 540 and a solder-resist layer 550. In the wiring board 500, the wiring layer 540 is formed on the insulation layer 530, and the solder-resist layer 550, which has aperture parts 550x, is formed on the insulation layer 530. For example, the wiring layer 540 is formed of copper (Cu) or the like. The insulation layer 530 may be formed of, for example, an epoxy resin, a glass epoxy (epoxy resin impregnated glass cloth), etc.

The connection terminals 430 of the semiconductor device 400 are electrically connected to the wiring layer 540 of the wiring board 500 at positions exposed by the aperture parts 550x of the solder resist layer 550. The above-mentioned semiconductor package structure is disclosed in, for example, Japanese Laid-Open Patent Applications No. 2008-153340 and No. 2009-166773.

If a glass epoxy is used to form the insulation layer 530, the thermal expansion coefficient of the insulation layer 530 is about 18 ppm/° C. On the other hand, if silicon is used to form the semiconductor substrate 410, the thermal expansion coefficient of the semiconductor substrate 410 is about 3 ppm/° C. Thus, there is a large difference in thermal expansion coefficient between the insulation layer 530 and the semiconductor substrate 410. When heat is applied to the semiconductor package 300, expansion of the wiring board 500 is much larger than expansion of the semiconductor substrate 410. Thereby, a stress is generated in the joining parts (connection terminals 430) between the semiconductor package 300 and the wiring board 500. Thus, there is a problem in that a crack may be generated at an interface between each of the connection terminals 430 and the wiring layer 540 or in portions of the semiconductor substrate 410 near the connection terminals 430.

SUMMARY

According to one embodiment, a semiconductor package includes: a wiring board; and a semiconductor device mounted on the wiring board, wherein the semiconductor device includes: a semiconductor substrate; a penetration electrode penetrating the semiconductor substrate; a cavity part formed in the semiconductor substrate to isolate the penetration electrode from the semiconductor substrate; and a connection terminal provided at a position where the connection terminal does not overlap the penetration electrode in a plan view, the connection terminal electrically connecting the semiconductor device to the wiring board.

According to another embodiment, a semiconductor package includes: a wiring board; a rewiring substrate; and a semiconductor device mounted on the wiring board by way of the rewiring substrate, wherein the rewiring substrate includes: a substrate; a penetration electrode penetrating said substrate; a cavity part formed in the substrate to isolate the penetration electrode from the substrate; and a connection terminal provided at a position where the connection terminal does not overlap the penetration electrode in a plan view, the connection terminal electrically connecting the semiconductor device to the rewiring substrate and the wiring board.

The object and advantages of the embodiment will be realized and attained by means of the elements and combinations particularly pointed out in the appended claims.

It is to be understood that both the foregoing general description and the following detailed description are exemplary only and are not restrictive of the invention, as claimed.

BRIEF DESCRIPTION OF DRAWINGS

FIG. 11A is a view for explaining an eighth step of the manufacturing method;

FIG. 21 is a cross-sectional view of a semiconductor package according to a second embodiment.

DESCRIPTION OF EMBODIMENT(S)

Preferred embodiments of the present invention will be explained with reference to the accompanying drawings.

Figure 1:
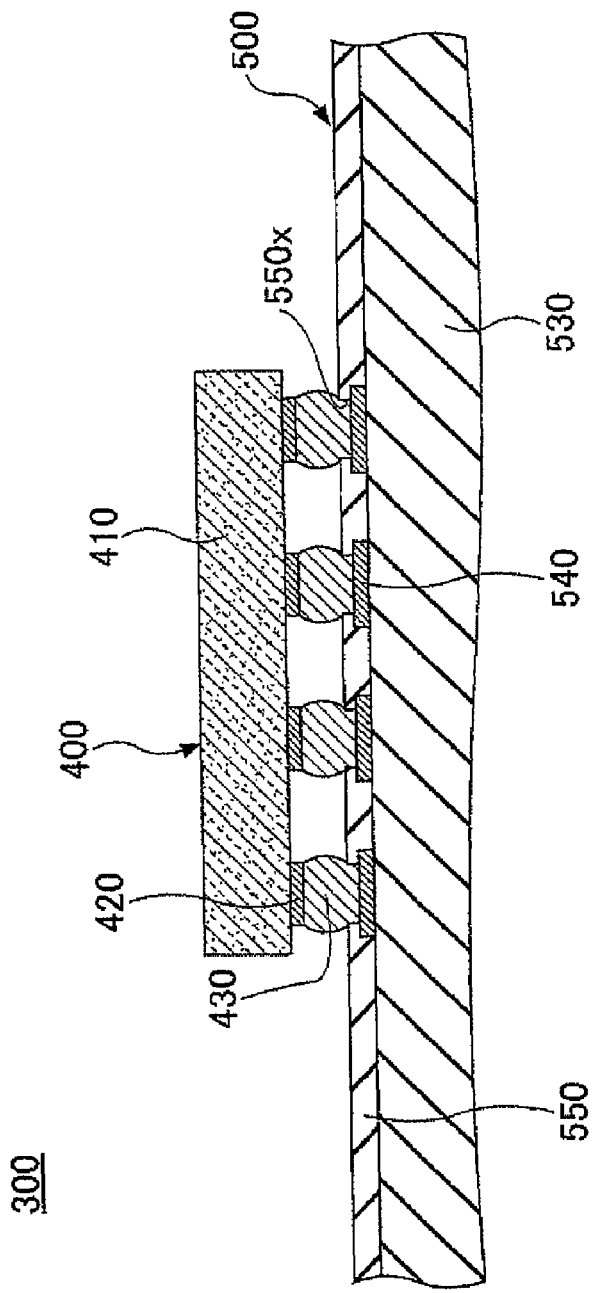
FIG. 1 is a cross-sectional view illustrating a part of a conventional semiconductor package.
Figure 2:
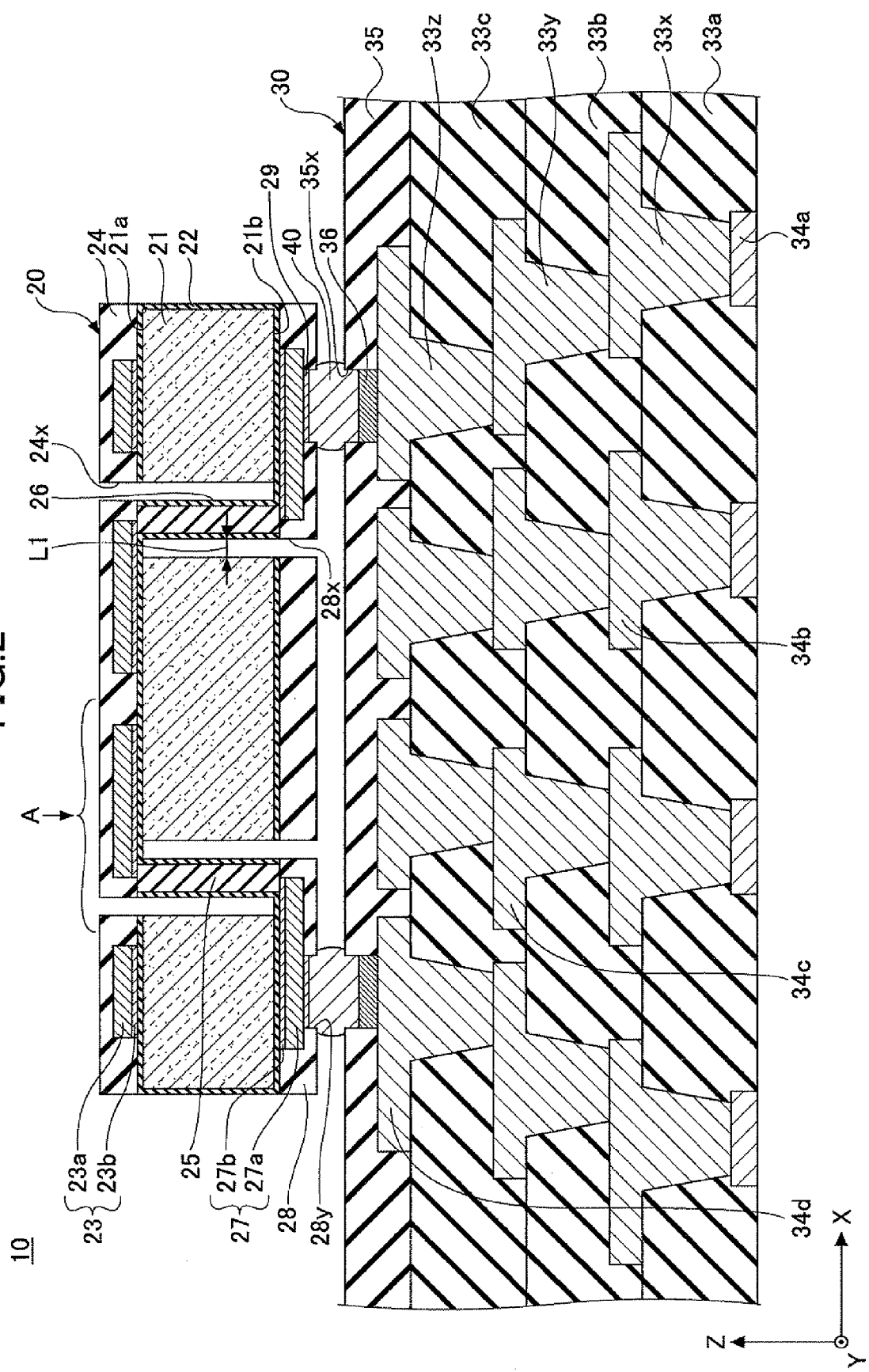
FIG. 2 is a cross-sectional view illustrating a semiconductor package according to a first embodiment.
Figure 3:
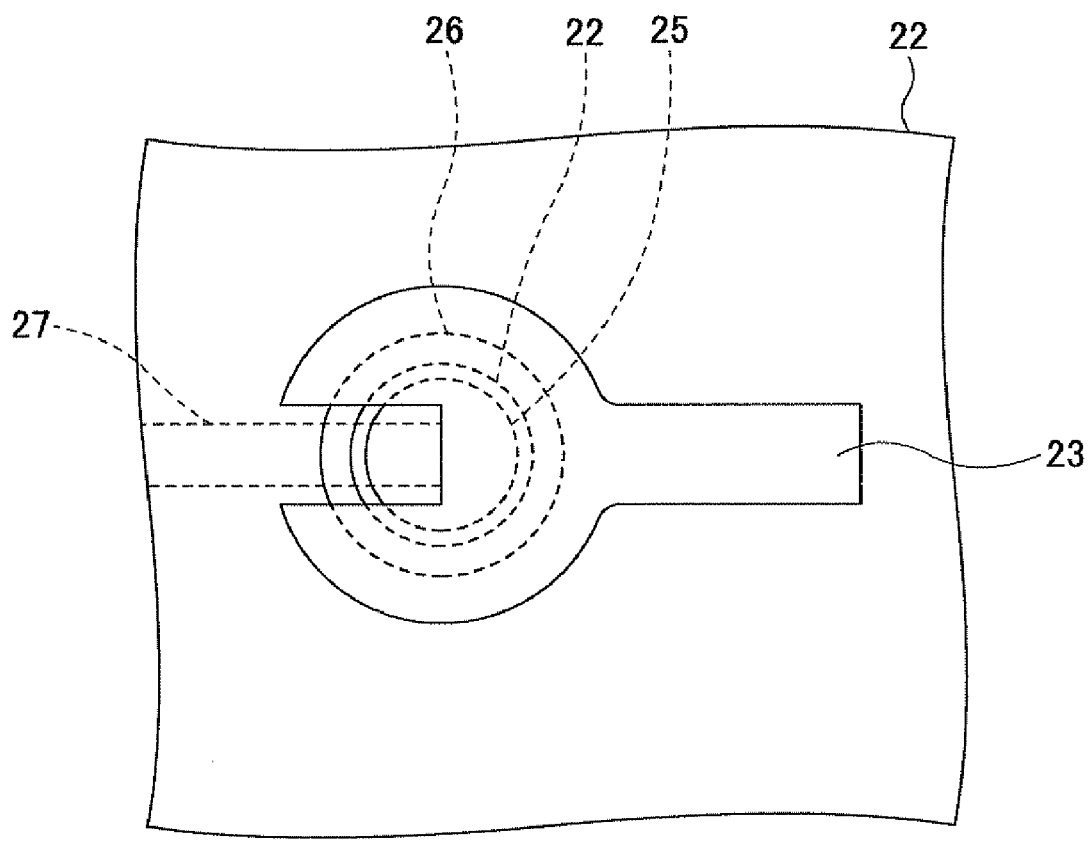
FIG. 3 is a plan view of a portion indicated viewed in a direction indicated by an arrow A in FIG. 2.

A description will now be given of a semiconductor package according to a first embodiment. FIG. 2 is a cross-sectional view illustrating a semiconductor package according to a first embodiment. FIG. 3 is a plan view of a portion indicated by A viewed in a direction indicated by an arrow in FIG. 2. In FIG. 3, a first insulation layer 24 mentioned later is omitted for clarity. In FIG. 2, the X-direction is a direction parallel to one surface 21a of a semiconductor substrate 21, the Y-direction is a direction perpendicular to the X-direction, and the Z-direction is a direction perpendicular to both the X-direction and the Y-direction.

With reference to FIG. 2 and FIG. 3, the semiconductor package 10 according to the first embodiment includes a semiconductor device 20 and a wiring board 30. The semiconductor device 20 includes a semiconductor substrate 21, an insulation film 22, a first wiring layer 23, a first insulation layer 24, penetration electrodes 25, cavity parts 26, a second wiring layer 27, a second insulation layer 28, a metal layer 29, and connection terminals 40.

The semiconductor substrate 21 has a semiconductor integrated circuit (not illustrated in the figure), which includes a diffusion layer (not illustrated in the figure), vias (not illustrated in the figure), etc. The semiconductor substrate 21 is formed of, for example, silicon. A thickness of the semiconductor substrate 21 can be set to 200 micrometers. The semiconductor substrate 21 is formed, for example, in a 20 mm square shape in a plan view. The plan view means viewing in the Z-direction.

The insulation film 22 is provided to cover the surface (except for an outer wall surface of each cavity part 26) of the semiconductor substrate 21. The insulation film 22 is a film for insulating between the semiconductor substrate 21 and the first wiring layer 23. An oxide film (for example, a thermally oxidized film) can be used to form the insulation film 22. If a thermally oxidized film is used as the insulation film 22, a thickness of the insulation film 22 can be set to 1.5 μm.

The first wiring layer 23 includes a first metal layer 23a and a second metal layer 23b. The first wiring layer 23 is formed on a surface 21a of the semiconductor substrate 21 by way of the insulation film 22. For example, Cu is used as a material of the first metal layer 23a. A thickness of the first metal layer 23a can be set to about 5 μm. For example, Ti is used as a material of the second metal layer 23b. A thickness of the second metal layer 23b can be set to about 100 nm.

The first insulation layer 24 is formed on the surface 21a of the semiconductor substrate 21 by way of the insulation film 22 to cover the first wiring layer 23. The first insulation layer 24 has aperture parts 24x, each of which exposes a portion of the cavity part 26. For example, a polyimide resin can be used to form the first insulation layer 24. A thickness of the first insulation layer 24 can be set to, for example, about 10 μm.

The penetration electrodes 25 are electrodes penetrating the semiconductor substrate 21 and extending from the surface 21a to an opposite surface 21b of the semiconductor substrate 21. An end of each penetration electrode 25 is electrically connected to the first wiring layer 23. The other end of each penetration electrode 25 is electrically connected to the second wiring layer 27. Although a pitch of the penetration electrodes 25 can be set arbitrarily, the pitch is set to 200 μm in the present embodiment.

The penetration electrode 25 is circular in a plan view (viewing from a side of the surface 21a of the semiconductor substrate 21). A diameter of the penetration electrode 25 can be set to 100 μm. For example, Cu is used to form the penetration electrode 25.

The cavity part 26 is provided around each penetration electrode 25 so that a portion of the insulation film 22 formed on the side surface of the penetration electrode 25 is exposed. The cavity part 26 is formed in an annular shape in a plan view (viewing from the side of the surface 21a of the semiconductor substrate 21). An outer diameter of the cavity part 26 can be set to, for example, 160 μm, and an inner diameter of the cavity part 26 can be set to, for example, 100 μm. In this case, a width L1 of the cavity part 26 is set to 30 μm. However, the width L1 is not limited to 30 μm, and may be set to about 10 to 100 μm.

The second wiring layer 27 includes a first metal layer 27a and a second metal layer 27b. The second wiring layer 27 is formed on the surface 21b of the semiconductor substrate 21 by way of the insulation film 22. For example, Cu is used to form the first metal layer 27a. A thickness of the first metal layer 27a can be set to about 5 μm. For example, Ti is used to form the second metal layer 27b. A thickness of the second metal layer 27b can be set to about 100 nm.

The second insulation layer 28 is formed on the surface 21b of the semiconductor substrate 21 by way of the insulation film 22 to cover the second wiring layer 27. The second insulation layer 28 has aperture parts 28x, each of which exposes a portion of the cavity part 26, and aperture parts 28y, each of which exposes a portion of the second wiring layer 27. For example, a polyimide resin can be used to form the second insulation layer 28. A thickness of the second insulation layer 28 can be set to about 10 μm.

The metal layer 29 is formed on the second wiring layer 27 exposed in the aperture part 28y. For example, Au can be used to form the metal layer 29. As a material of the metal layer 29, a Ni/Au layer may be used in which Ni and Au are laminated in that order on the second wiring layer 27, or a Ni/Pd/Au layer may be used in which Ni, Pd and Au are laminated in that order on the second wiring layer 27. Additionally, the metal layer 29 is not always formed. If a Ni/Pd/Au layer is used as the metal layer 29, a thickness of the Ni layer may be set to 1 μm, a thickness of the Pd layer may be 1 μm, and a thickness of the Au layer may be 0.05 μm.

The connection terminals 40 are formed on portions of the metal layer 29 exposed in the aperture parts 28y, respectively. The connection terminals 40 are electrically connected to the first wiring layer 23 by way of the penetration electrodes 25, respectively. The connection terminals 40 are terminals connected to the metal layer 36 of the wiring layer 30 in order to electrically connect the semiconductor device 20 to the wiring layer 30. A solder ball, an Au bump, a conductive paste, etc., may be used as the connection terminal 40. If a solder ball is used as the connection terminal 40, a material of the connection terminal 40 may be an alloy containing Pb, an alloy of Sn and Bi, an alloy of Sn and Cu, an alloy of Sn and Ag, an alloy of Sn, Ag and Cu, etc.

The wiring board 30 is a wiring board containing a built-up wiring layer having a first insulation layer 33a, a second insulation layer 33b, a third insulation layer 33c, a first wiring layer 34a, a second wiring layer 34b, a third wiring layer 34c, a fourth wiring layer 34d, a solder resist layer 35 and a metal layer 36. The wiring board 30 can be in a 40 mm square shape in a plan view.

The first wiring layer 34a is formed as a lowermost layer in the wiring board 30. The first insulation layer 33a is formed to cover the first wiring layer 34a, and the second wiring layer 34b is formed on the first insulation layer 33a. Additionally, the second insulation layer 33b is formed to cover the second wiring layer 34b, and the third wiring layer 34c is formed on the second insulation layer 33b. Further, the third insulation layer 33c is formed to cover the third wiring layer 34c, and the fourth wiring layer 34d is formed on the third insulation layer 33c. The first wiring layer 34a is exposed from the first insulation layer 33a so that the first wiring layer 34a serves as electrode pads to be connected to other boards such as a motherboard.

The first wiring layer 34a and the second wiring layer 34b are electrically connected each other by way of the first via holes 33x formed in the first insulation layer 33a. The second wiring layer 34b and the third wiring layer 34c are electrically connected each other by way of second via holes 33y formed in the second insulation layer 33b. The third wiring layer 34c and the fourth wiring layer 34d are electrically connected each other through third via holes 33z formed in the third insulation layer 33c.

The solder resist layer 35, which has aperture parts 35x, is formed to cover the fourth wiring layer 34d. The metal layer 36 is formed on the fourth wiring layer 34d in the aperture parts 35x of the solder resist layer 35. The metal layer 36 may be a Ni/Au plated layer in which a Ni plated layer and an Au plated layer are laminated in that order on the fourth wiring layer 34d in the aperture parts 35x of the solder resist layer 35. The metal layer 36 and the connection terminals 40 of the semiconductor device 20 are electrically connected to each other.

As mentioned above, the semiconductor device 20 is connected to the wiring board 30 electrically and mechanically through the connection terminals 40. Because the cavity part 26 is provided around each penetration electrode 25, each connection terminal 40 is slightly movable in the X-direction and the Y-direction.

Here, considering a case where heat is applied to the semiconductor package 10, it is considered that a stress is generated in the joining parts (in the vicinity of the connection terminals 40) because there is a difference in the thermal expansion coefficient between the semiconductor device 20 and the wiring board 30 as explained above. However, because each connection terminal 40 is slightly movable in the X-direction and the Y-direction, a stress generated in the joining parts (in the vicinity of the connection terminals 40) can be greatly relaxed. Therefore, generation of a crack in the joining parts is prevented.

A description will be given below of a manufacturing method of the semiconductor package according to the first embodiment. FIG. 4 through FIG. 15 are views for explaining a manufacturing method of the semiconductor package according to the first embodiment. In FIG. 4 through FIG. 15, parts that are the same as parts illustrated in FIG. 2 and FIG. 3 are given the same reference numerals, and descriptions thereof may be omitted.

Figure 4:
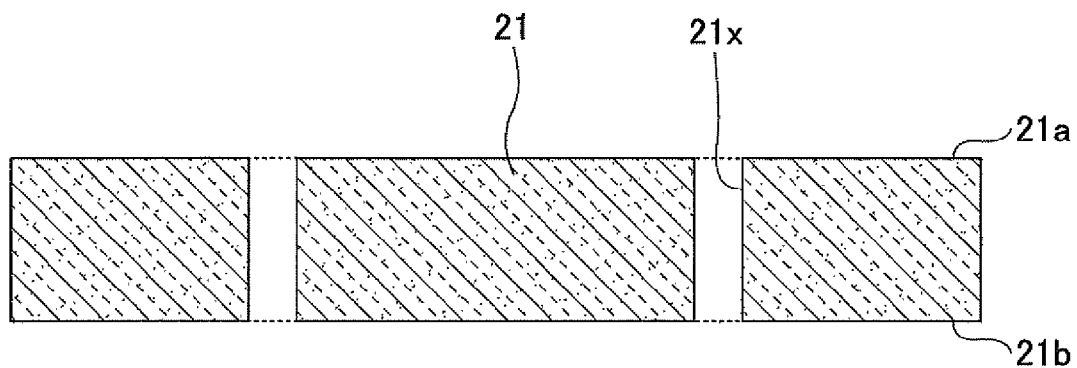
FIG. 4 is a view for explaining a first step of a manufacturing method of the semiconductor package according to the first embodiment.

First, in the process illustrated in FIG. 4, a plurality of penetration apertures 21x are formed in the semiconductor substrate 21, which constitutes the semiconductor device 20, so that the penetration apertures 21x extend from the surface 21a to the surface 21b of the semiconductor substrate 20. It is supposed that the semiconductor substrate 21 is formed of silicon, and the thickness of the semiconductor substrate 21 is 200 μm.

In a case where the semiconductor substrate 21 is formed of silicon, the penetration apertures 21x can be formed by an anisotropic etching method such as, for example, a deep reactive ion etching (DRIE). Each penetration aperture 21x has a circular shape in a plan view, and a diameter of each penetration aperture 21x can be 100 μm. A pitch of the penetration apertures 21x can be set to 200 μm. In the present embodiment, a description will be given below of the case where the semiconductor substrate 21 is formed of silicon.

Figure 5:
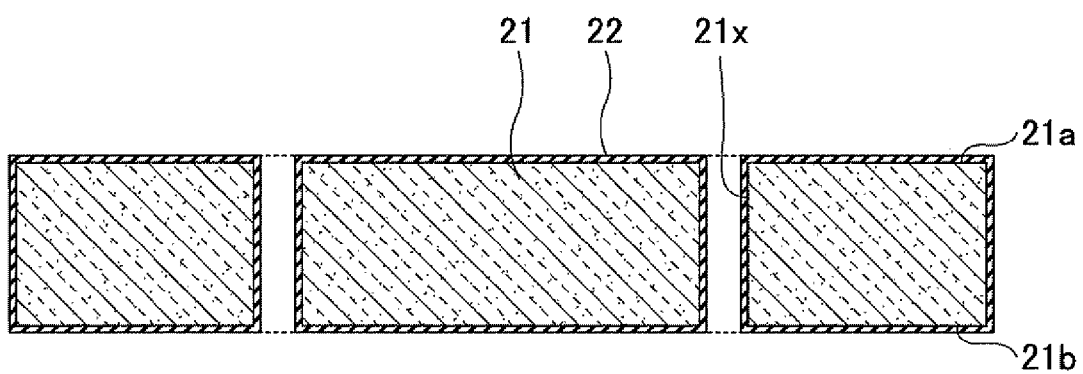
FIG. 5 is a view for explaining a second step of the manufacturing method.

Subsequently, in the process illustrated in FIG. 5, the insulation film 22 is formed to cover the surface of the semiconductor substrate 21 (including the surface of the semiconductor substrate 21 corresponding to wall surfaces of the penetration apertures 21x). For example, an oxide film $SiO_2$ (for example, a thermally oxidized film) is used to form the insulation film 22. If a thermally oxidized film is used as the insulation film 22, the thermally oxidized film can be formed to cover the semiconductor substrate 21 by thermally oxidizing the surface of the semiconductor substrate formed of silicon. If the thermally oxidized film is used as the insulation film 22, the thickness of the insulation film 22 can be set to, for example, 1.5 μm.

Figure 6:
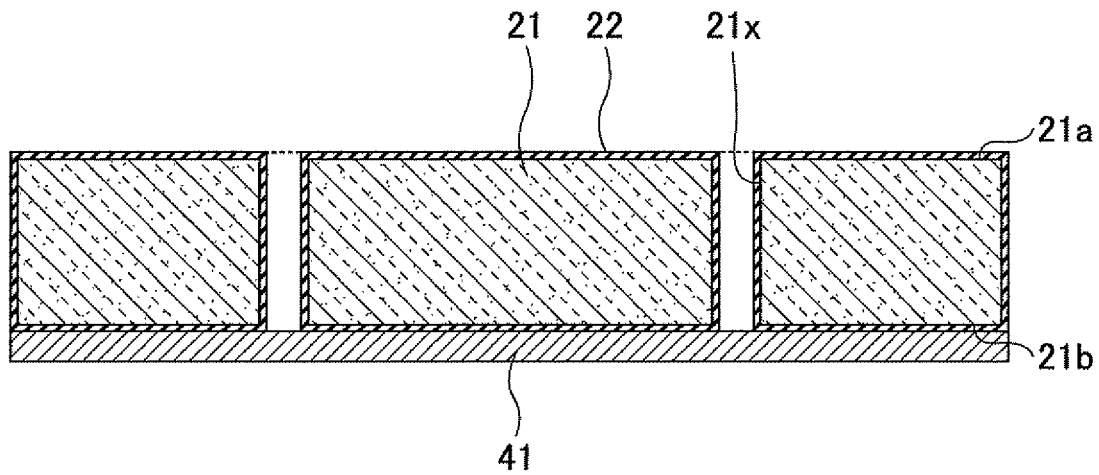
FIG. 6 is a view for explaining a third step of the manufacturing method.

Subsequently, in the process illustrated in FIG. 6, a metal plate 41 is applied onto a bottom surface of the structure illustrated in FIG. 5. The metal plate 41 is a member to serve as an electricity supply layer when forming the penetration electrode 25 by an electrolysis plating method. For example, a Cu plate is used to form the metal plate 41.

Figure 7:
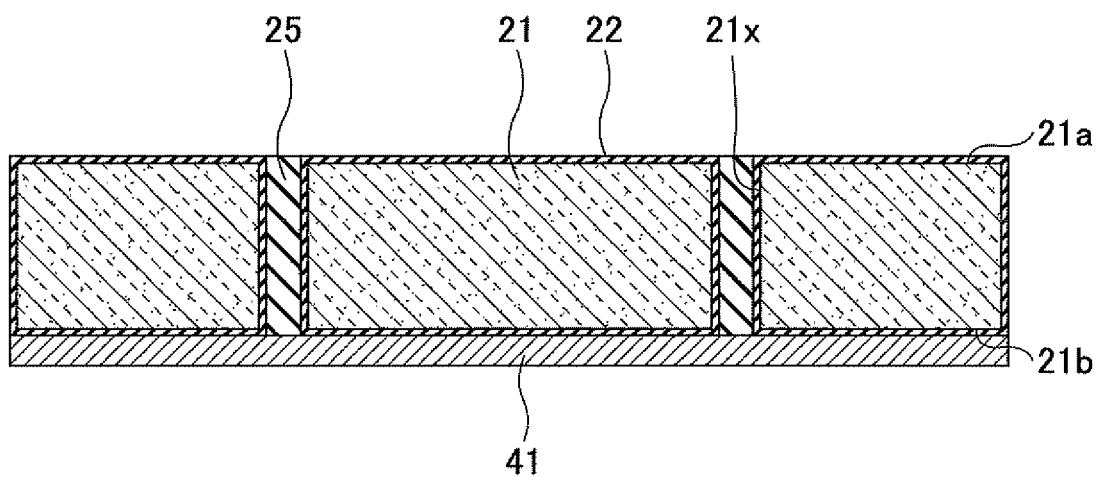
FIG. 7 is a view for explaining a fourth step of the manufacturing method.

Subsequently, in the process illustrated in FIG. 7, the penetration electrodes 25 are formed by depositing a plate film to fill the penetration apertures 21x by an electrolysis plating method using the metal plate 41 as an electricity supply layer. A Cu plating film may be used as the plating film forming the penetration electrodes 25.

Subsequently, in the process illustrated in FIG. 8, after removing the metal plate 41 provided to the structure illustrated in FIG. 7, the first wiring layer 23 and the second wiring layer 27 are formed, the first wiring layer 23 including the first metal layer 23a and the second metal layer 23b, the second wiring layer 27 including the first metal layer 27a and the second metal layer 27b. The first wiring layer 23 is connected to one end of each penetration electrode 25, and the second wiring layer 27 is connected to the other end of each penetration electrode 25. That is, the first wiring layer 23 and the second wiring layer 27 are electrically connected each other through the penetration electrodes 25. It should be noted that FIG. 8A is a cross-sectional view, FIG. 8B is a plan view of a portion viewed in a direction indicated by an arrow A, and FIG. 8C is a plan view of a portion viewed in a direction indicated by an arrow B.

The first wiring layer 23 and the second wiring layer 27 are formed according to, for example, a semi-additive method. A description will be given of an example of forming the first wiring layer 23 according to a semi-additive method. It should be noted that the second wiring layer 27 can be formed in the same manner. First, a seed layer (not illustrated in the figure) used as the second metal layer 23b is formed on the entire surface 21a of the semiconductor substrate 21 by an electroless plating method or a sputter method. Ti may be used to form the seed layer. A thickness of the seed layer can be, for example, 100 nm. Then, a resist layer (not illustrated in the figure) having aperture parts corresponding to the first wiring layer 23 is formed on the seed layer. Then, the first metal layer 23a is formed in the aperture parts of the resist layer by an electrolysis plating method using the seed layer as a plating electricity supply layer. For example, Cu is used to form the first metal layer 23a. A thickness of the first metal layer 23a can be set to about 5 μm.

Then, after removing the resist layer, the first wiring layer 23 is formed by removing the seed layer by etching using the first metal layer 23a as a mask. As a formation method of the first wiring layer 23 and the second wiring layer 27, various kinds of wiring formation methods such as a subtractive method may be used other than the above-mentioned semi-additive method.

Figure 8A:
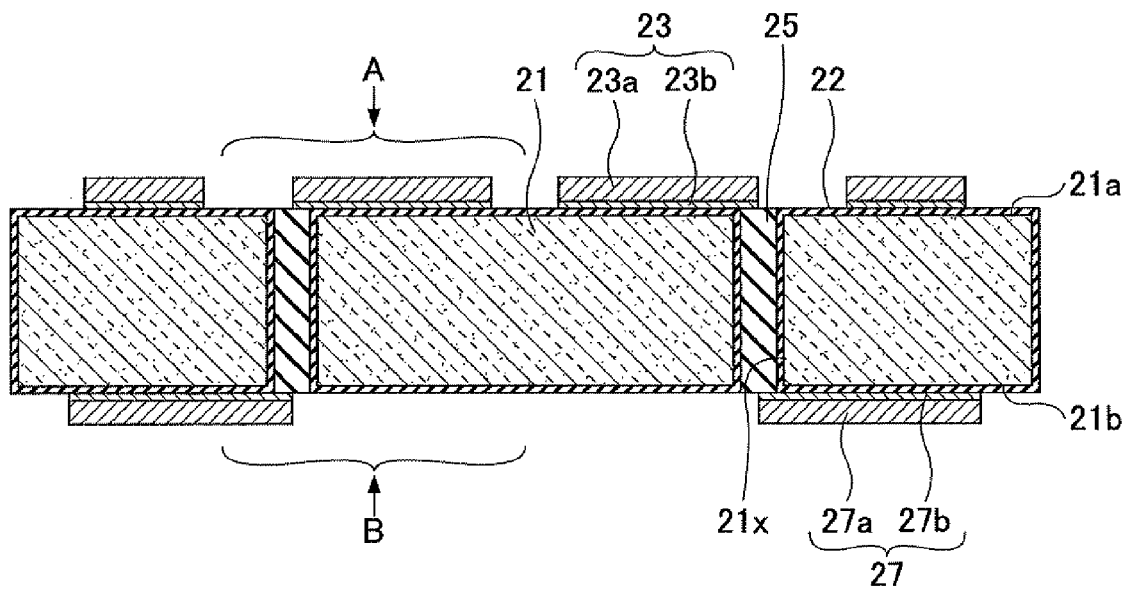
FIG. 8A is a view for explaining a fifth step of the manufacturing method.
Figure 8B:
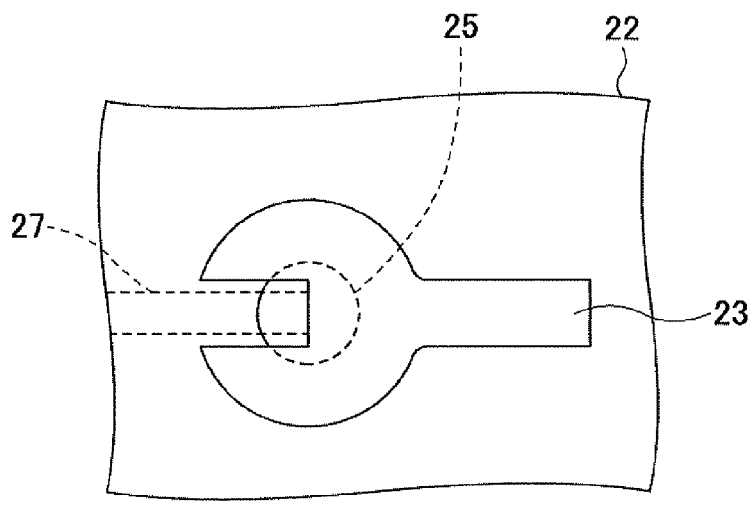
FIG. 8B is a plan view of a portion viewed in a direction indicated by an arrow A in FIG. 8A.
Figure 8C:
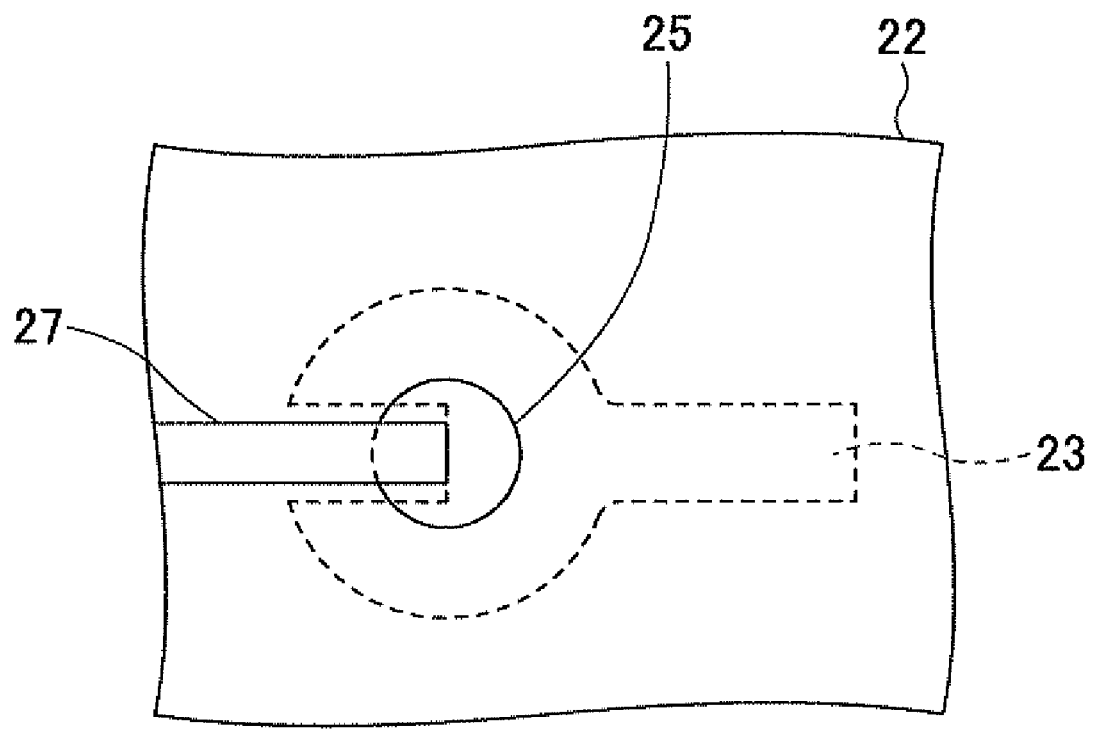
FIG. 8C is a plan view of a portion viewed in a direction indicated by an arrow B in FIG. 8A.

As illustrated in FIG. 8A and FIG. 8B, the first wiring layer 23 is formed in a shape so that the first wiring layer 23 does not overlap a portion in the vicinity of a portion where the penetration electrode 25 and the second wiring layer 27 are adjacent to each other in a plan view. This is to form the cavity part 26y by an anisotropic etching method from the side of the surface 21a in the process illustrated in FIG. 12 mentioned later. If the first wiring layer 23 does not have such a shape, it is difficult to form the cavity part 26 to cause the insulation film 22 formed on the side surface of the penetration electrode 25 to be exposed completely. The size of the portion of the first wiring layer 23 where the first wiring layer 23 does not overlap the portion where the penetration electrode 25 and the second wiring layer 27 are adjacent to each other in a plan view can be a size which can contain the cavity part 26y mentioned later in a plan view.

Figure 9:
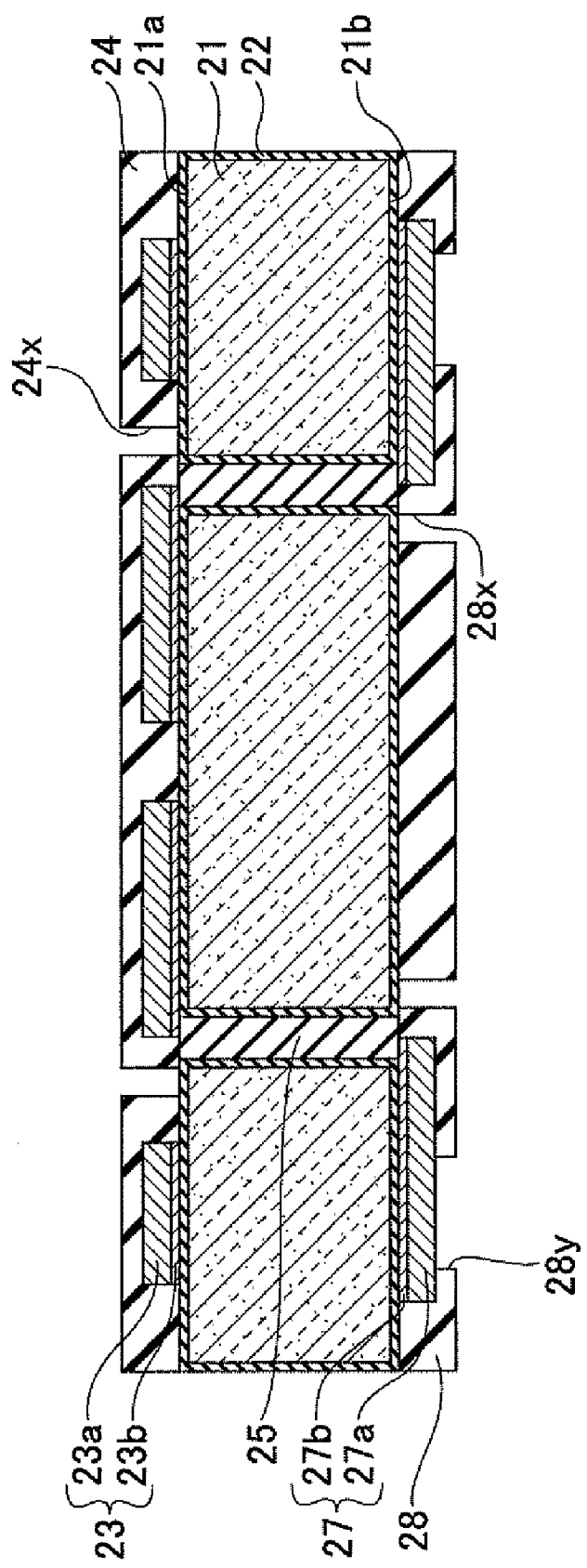
FIG. 9 is a view for explaining a sixth step of the manufacturing method.

Subsequently, in the process illustrated in FIG. 9, the first insulation layer 24 having aperture parts 24x is formed on the surface 21a of the semiconductor substrate 21 by way of the insulation film 22 in order to cover the first wiring layer 23. Additionally, the second insulation layer 28 having aperture parts 28x and 28y is formed on the surface 21b of the semiconductor substrate 21 by way of the insulation film 22 in order to cover the second wiring layer 27. The aperture parts 24x and the aperture parts 28x are formed in order to expose portions of the insulation film 22 corresponding to at least the cavity parts 26x and 26y mentioned later. Additionally, the aperture parts 28y are formed to expose a portion of the second wiring layer 27.

As a material of the first insulation layer 24 and the second insulation layer 28, a polyimide resin or the like may be used. A thickness of each of the first insulation layer 24 and the second insulation layer 28 can be set to 10 μm. The first insulation layer 24 and the second insulation layer 28 can be formed by laminating a resin film to cover the first wring layer 23 and the second wiring layer 27 and pressing the laminated film, and, thereafter, curing the resin film by heat-treatment at a temperature of about 190° C.

Figure 10:
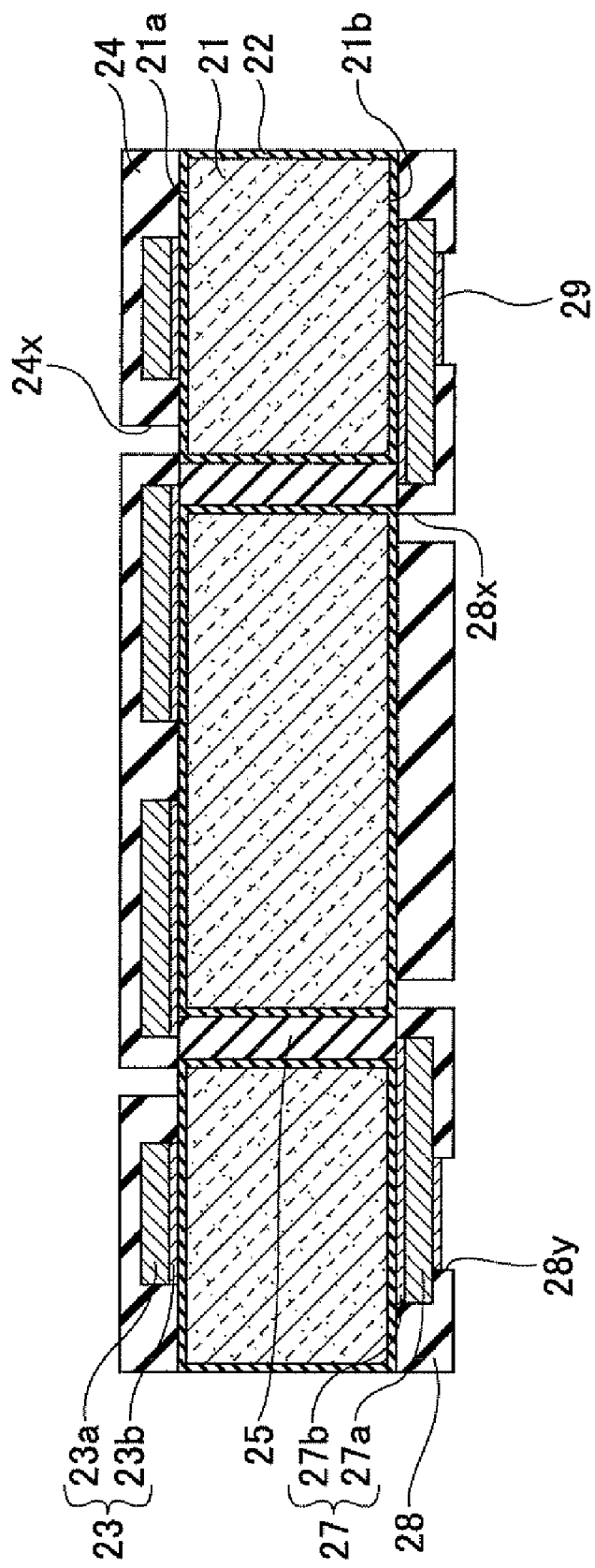
FIG. 10 is a view for explaining a seventh step of the manufacturing method.

Subsequently, in the process illustrated in FIG. 10, the metal layer 29 is formed on the second wiring layer 27 exposed in the aperture parts 28y. The metal layer 29 can be formed for example, by an electroless plating method. For example, Au is used to form the metal layer 29. As a material of the metal layer 29, a Ni/Au layer may be used in which Ni and Au are laminated in that order on the second wiring layer 27, or a Ni/Pd/Au layer may be used in which Ni, Pd and Au are laminated in that order on the second wiring layer 27. Additionally, the metal layer 29 is not always be formed. If a Ni/Pd/Au layer is used as the metal layer 29, a thickness of the Ni layer may be set to 1 μm, a thickness of the Pd layer may be 1 μm, and a thickness of the Au layer may be 0.05 μm.

Figure 11B:
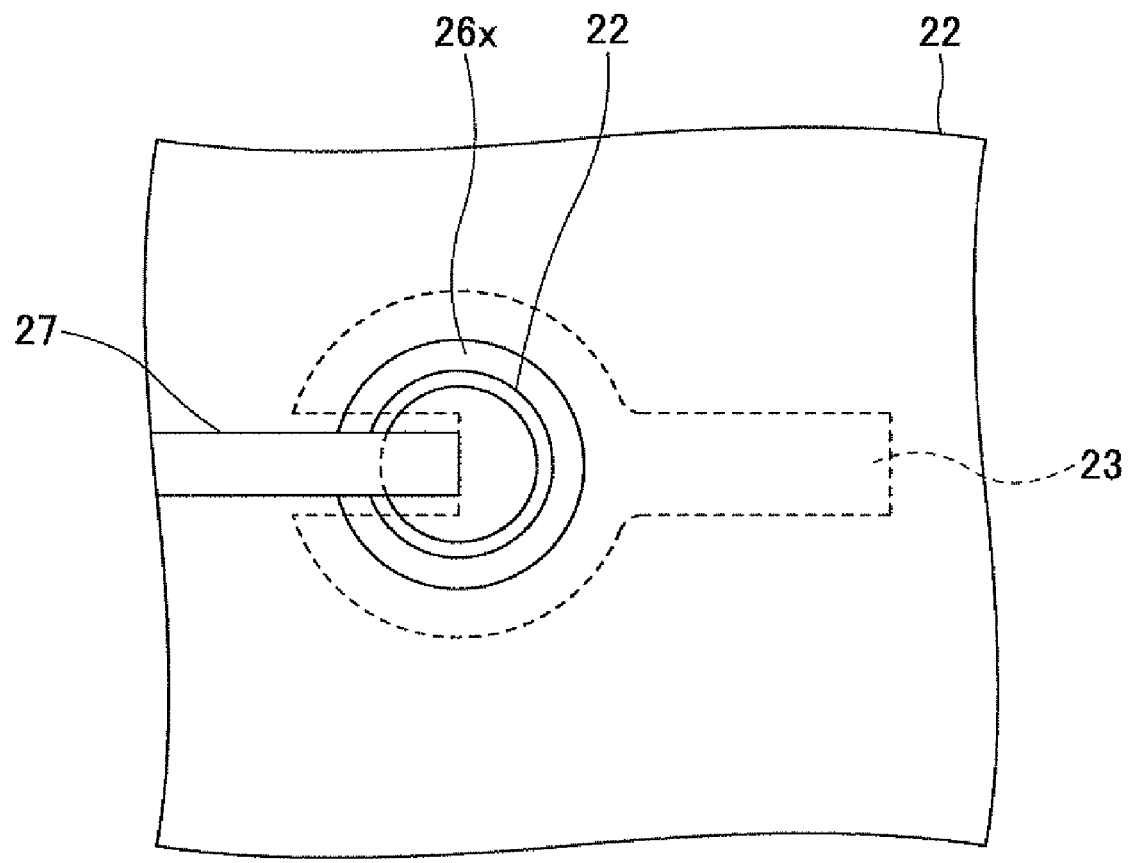
FIG. 11B is a plan view of a portion viewed in a direction indicated by an arrow B in FIG. 11A.

Subsequently, in the process illustrated in FIG. 11, cavity parts 26x are formed to expose the insulation film 22 formed on the side surfaces of the penetration electrodes 25. At this time, the insulation film 22 formed on the side surfaces of the penetration electrodes 25 may be removed to expose the side surfaces of the penetration electrodes 25. It should be noted that FIG. 11A is a cross-sectional view, and FIG. 11B is a plan view viewing a portion in a direction indicated by an arrow B in FIG. 11A. However, in FIG. 11B, the second insulation layer 28 is omitted for the sake of convenience of illustration.

The cavity parts 26x are formed by an anisotropic etching method such as, for example, a deep reactive ion etching (DRIE) from the side of the surface 21b of the semiconductor substrate 21. $CF_4$ can be used to remove $SiO_2$ forming the insulation film 22. $SF_6$ can be used to remove silicon forming the semiconductor substrate 21. $SiO_2$ forming the insulation film 22 is hardly removed by $SF_6$.

It should be noted that in the process illustrated in FIG. 11, the entire insulation film 22 formed on the side surface of the penetration electrodes 25 (or the side surfaces of the penetration electrodes 25) cannot be exposed because the semiconductor substrate 21 and the insulation film 22 in the portion where they overlap the second wiring layer 27 in a plan view cannot be removed from the side of the surface 21b of the semiconductor substrate 21 due to the presence of the second wiring layer 27.

Figure 12A:
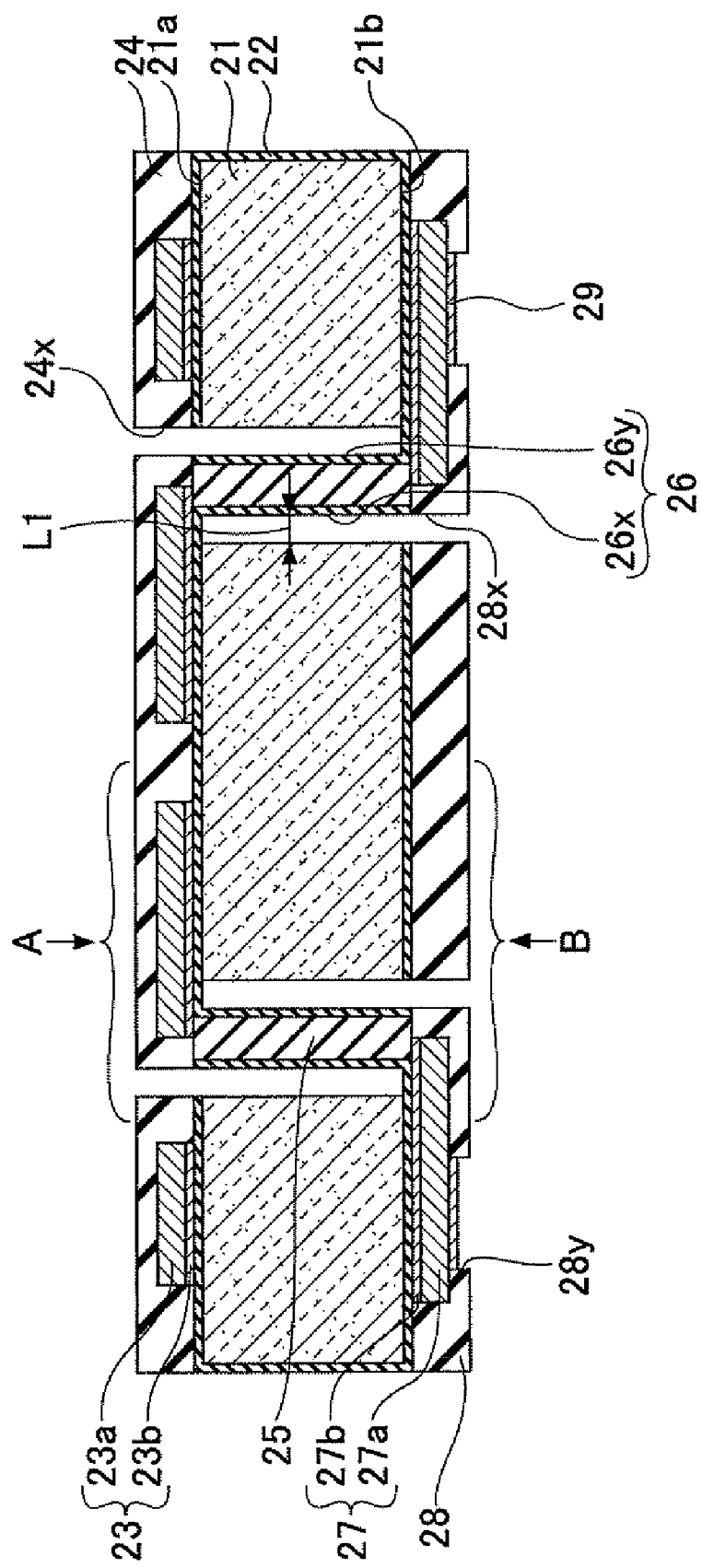
FIG. 12A is a view for explaining a ninth step of the manufacturing method.
Figure 12B:
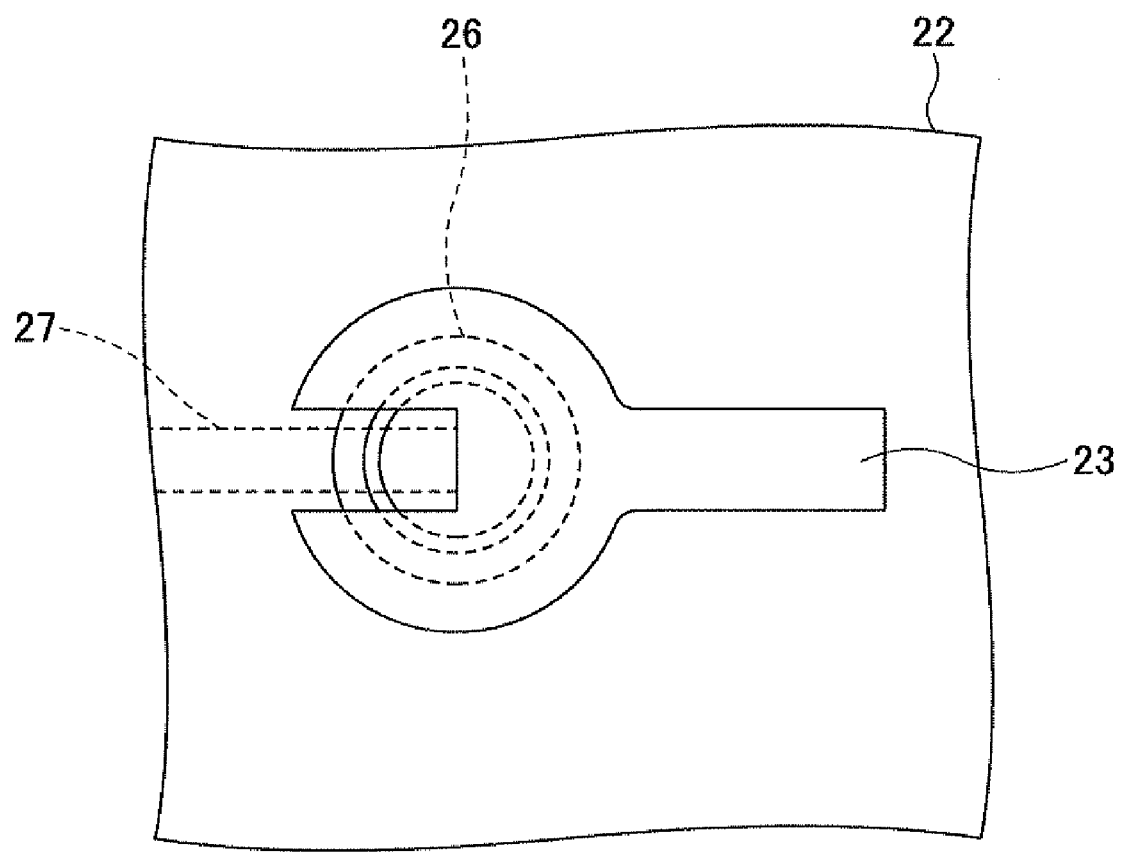
FIG. 12B is a plan view of a portion viewed in a direction indicated by an arrow A in FIG. 12A.

Subsequently, in the process illustrated in FIG. 12, the cavity parts 26y are formed to completely expose the insulation film 22 formed on the side surfaces of the penetration electrodes 25. At this time, the insulation film 22 formed on the side surfaces of the penetration electrodes 25 may be removed in order to completely expose the side surfaces of the penetration electrodes 25 by the cavity parts 26y. It should be noted that FIG. 12A is a cross-sectional view, and FIG. 12B is a plan view of a portion viewing in a direction indicated by an arrow A in FIG. 12A. In FIG. 12B, the first insulation layer 24 is omitted for the sake of convenience of illustration.

The cavity parts 26y are formed by an anisotropic etching method such as, for example, a deep reactive ion etching (DRIE) from the side of the surface 21a of the semiconductor substrate 21. $CF_4$ can be used to remove $SiO_2$ forming the insulation film 22. $SF_6$ can be used to remove silicon forming the semiconductor substrate 21. $SiO_2$ forming the insulation film 22 is hardly removed by $SF_6$.

The cavity parts 26 are completed by forming the cavity parts 26x and 26y, and the entire insulation film 22 formed on the side surfaces of the penetration electrodes 25 (or the side surfaces of the penetration electrodes 25) is exposed completely. Each cavity part 26 is formed in an annular shape around the penetration electrode 25 in a plan view (viewed from the side of the surface 21a of the semiconductor substrate 21). An outer diameter of the cavity part 26 is, for example, 160 μm, and an inner diameter of the cavity part 26 is, for example, 100 μm. In this case, a width L1 of the cavity part 26 is 30 μm. The width L1 corresponds to a gap between the semiconductor substrate 21 in the portion where the cavity part 26 is formed and the insulation film 22 formed on the side surface of the penetration electrode 25.

Figure 13:
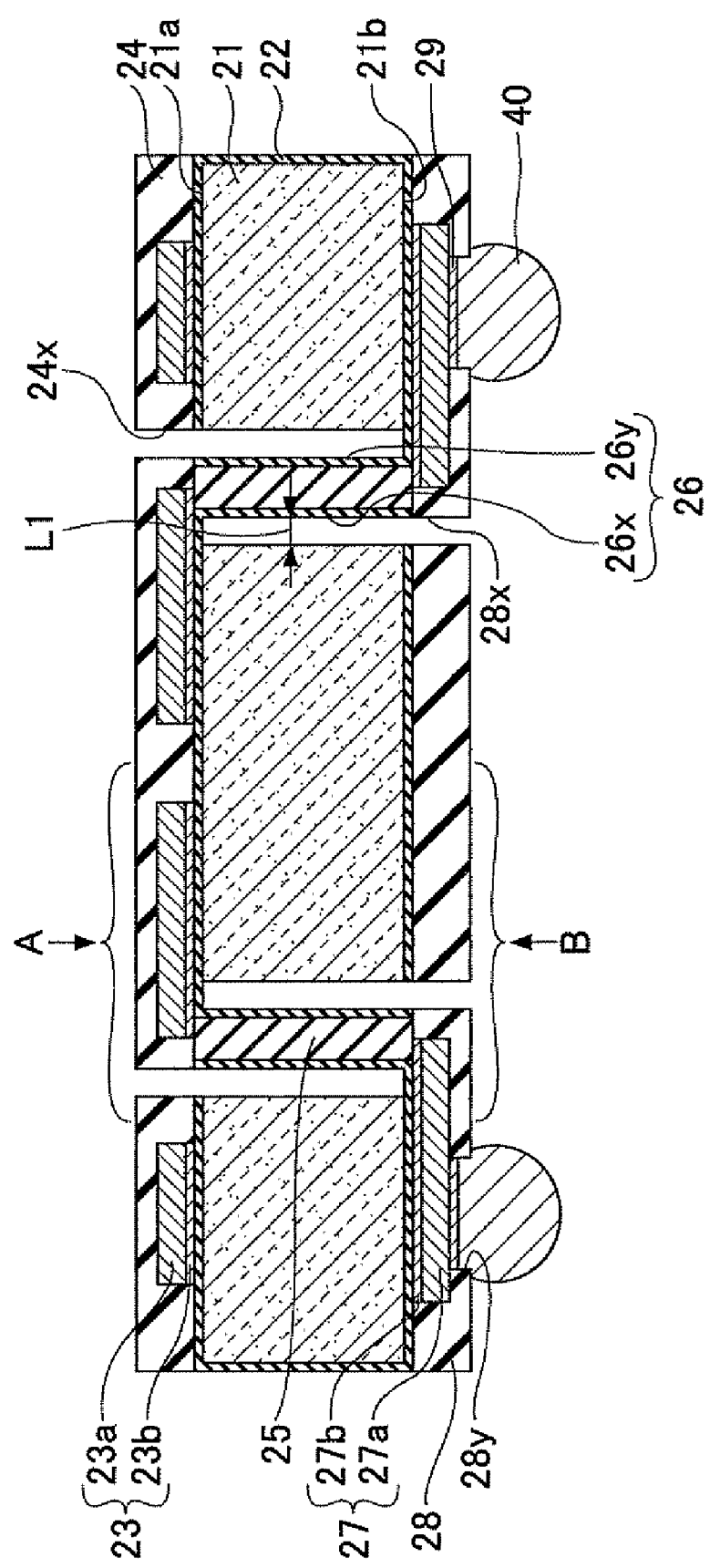
FIG. 13 is a view for explaining a tenth step of the manufacturing method.

Subsequently, in the process illustrated in FIG. 13, the connection terminals 40 are formed on the metal layer 29 exposed in the aperture parts 28y. Because the connection terminals 40 are not directly formed on one end of each penetration electrode but formed on the metal layer 29 by way of the first wiring layer 23, the connection terminals 40 can be arranged freely without depending on the positions of the penetration electrodes 25 (redistribution). A solder ball, an Au bump, a conductive paste, etc., may be used as the connection terminal 40. If a solder ball is used as the connection terminal 40, a material of the connection terminal 40 may be an alloy containing Pb, an alloy of Sn and Bi, an alloy of Sn and Cu, an alloy of Sn and Ag, an alloy of Sn, Ag and Cu, etc. The connection terminal 40 has a function to electrically connect the semiconductor device 20 to the wiring board 30.

Figure 14:
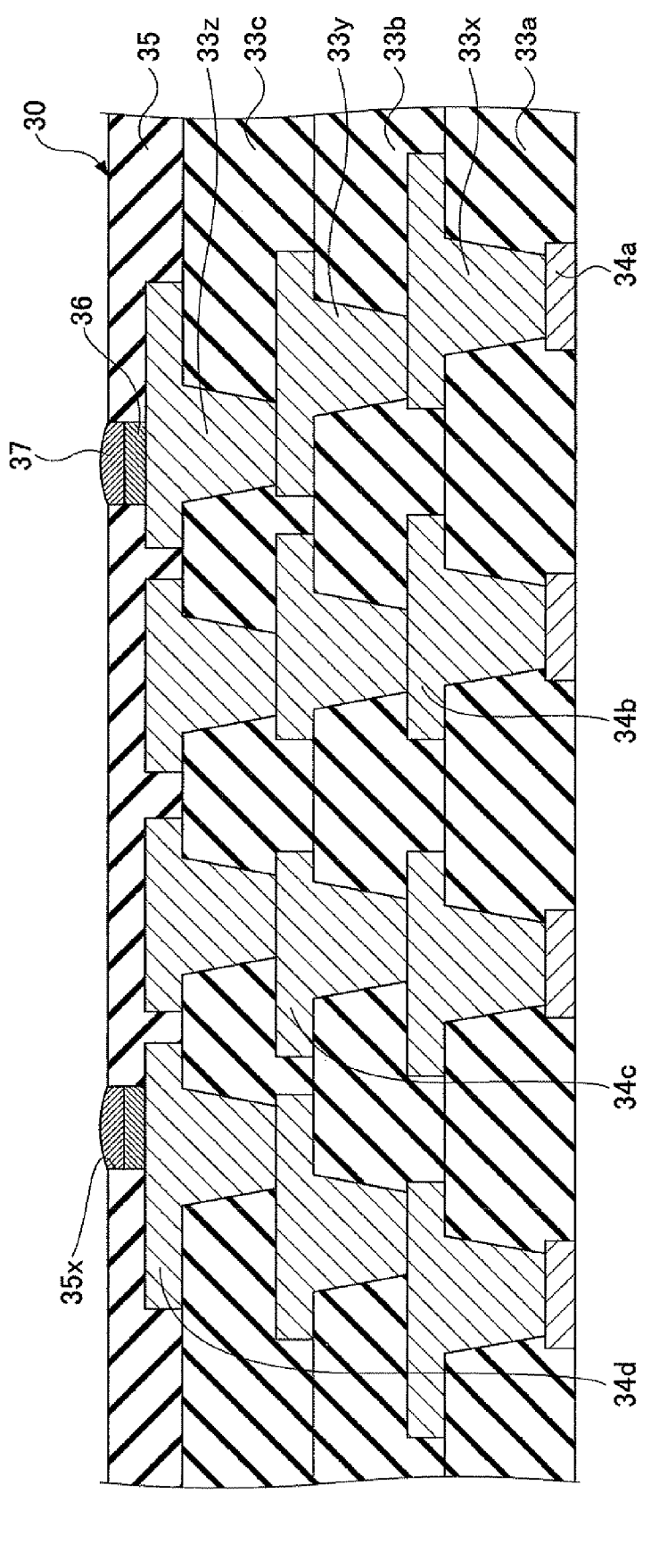
FIG. 14 is a view for explaining an eleventh step of the manufacturing method.
Figure 15:
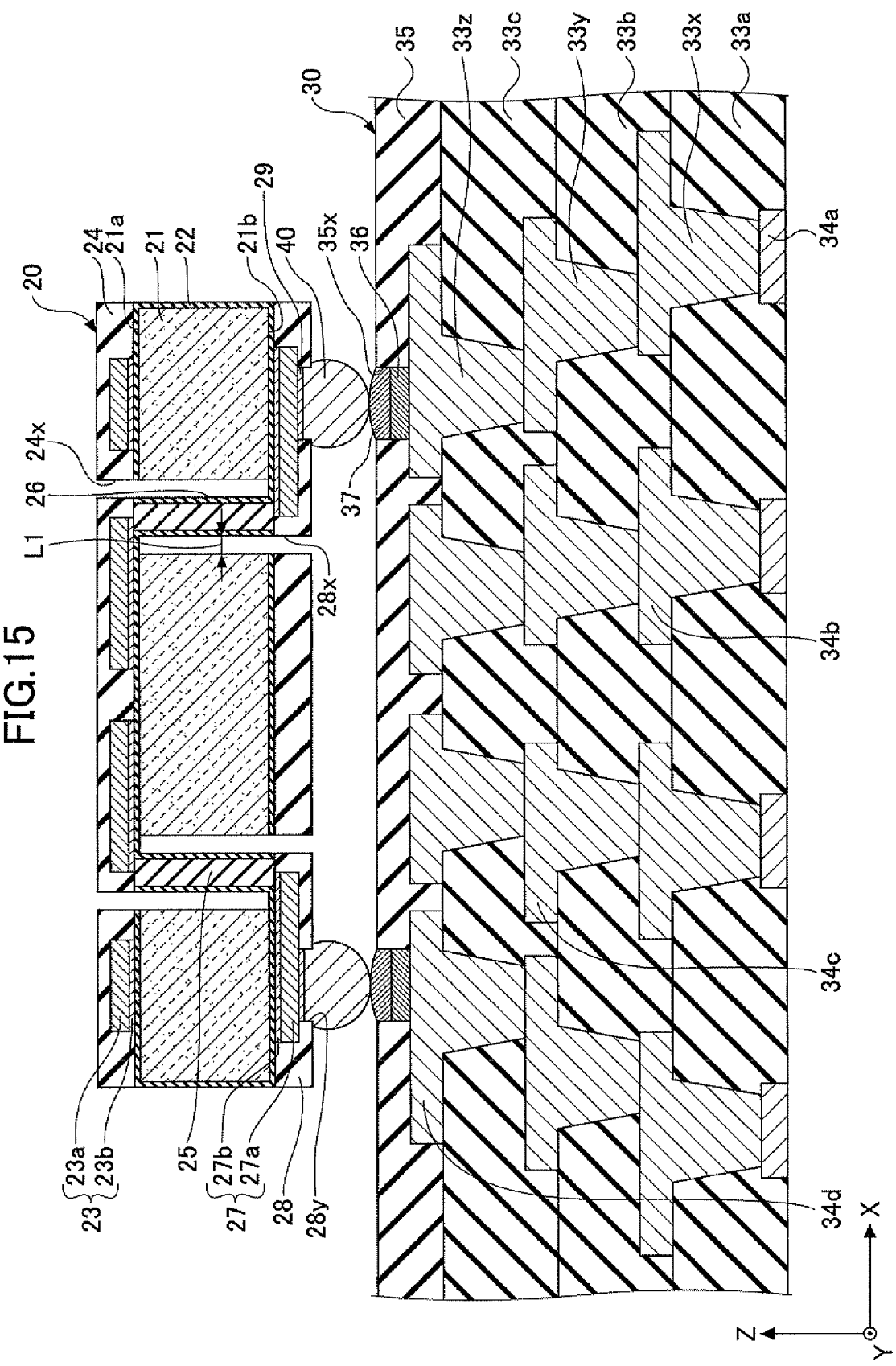
FIG. 15 is a view for explaining a twelfth step of the manufacturing method.

Subsequently, in the process illustrated in FIG. 14, the wiring board 30 is prepared. A pre-solder 37 is formed on the metal layer 36 of the wiring board 30. The pre-solder 37 is obtained by applying a solder paste onto the metal layer 36 and applying a reflow process to the solder paste. A manufacturing method of the wiring board 30 is well known, and a description thereof will be omitted. Subsequently, in the process illustrated in FIG. 15, the connection terminal 40 of the semiconductor device 20 are electrically connected to the pre-solder 37 of the wiring board 30. The connection of the connection terminal 40 to the pre-solder 37 is performed by melting the solder by heating, for example, at a temperature of 230° C. If the connection terminal 40 of the semiconductor device 20 is formed by a solder, the connection terminal 40 and the pre-solder 37 are melted to form an alloy, thereby forming a bump of the alloy. Thus, the semiconductor package illustrated in FIG. 2 is completed.

A description will be given below of a result of S parameter simulation performed on the semiconductor package according to the first embodiment.

Figure 16:
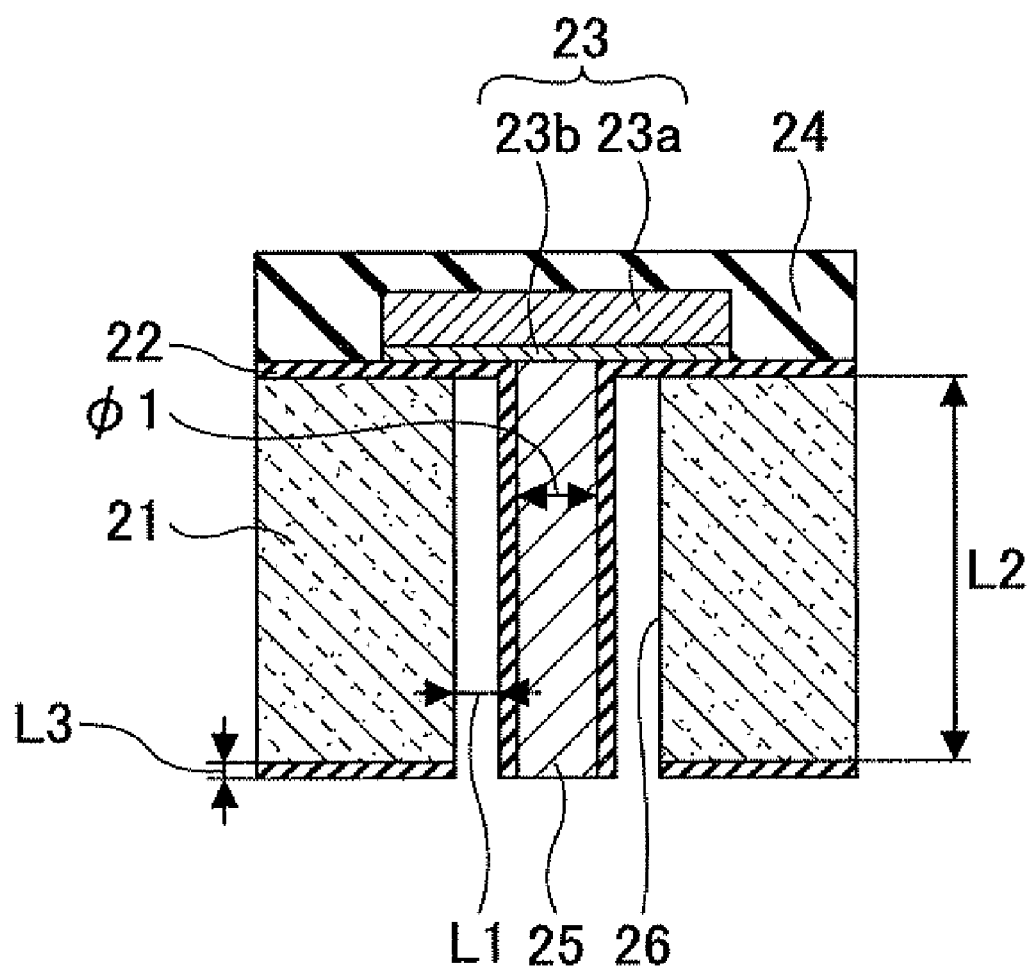
FIG. 16 is a cross-sectional view of a part of the semiconductor package used in a simulation.

S parameter simulation was performed on the semiconductor package and a comparison example 1. FIG. 16 is a cross-sectional view of a part of the semiconductor package used in the simulation. In the semiconductor package illustrated in FIG. 16, it was assumed that the semiconductor substrate 21 is formed of Si, the insulation film is formed of $SiO_2$, the first wiring layer 23 and the penetration electrode 25 are formed of Cu, and the first insulation layer 24 is formed of polyimide. The width L1 of the cavity part 26 was set to a variable value (L1=variable), the thickness L2 of the semiconductor substrate was set to 200 μm (L2=200 μm), the thickness L3 of the insulation film 22 was set to 1.5 μm (L3=1.5 μm), and the diameter φ1 of the penetration electrode 25 was set to 100 μm (φ1=100 μm). A sample of which L1 is set to 30 μm in FIG. 16 was referred to as a sample A, which corresponds to the semiconductor package according to the first embodiment. A sample of which L1 is set to 0 μm in FIG. 16 (that is, a sample having no cavity part) was referred to as a sample B, which corresponds to the comparison example 1.

Figure 17A:
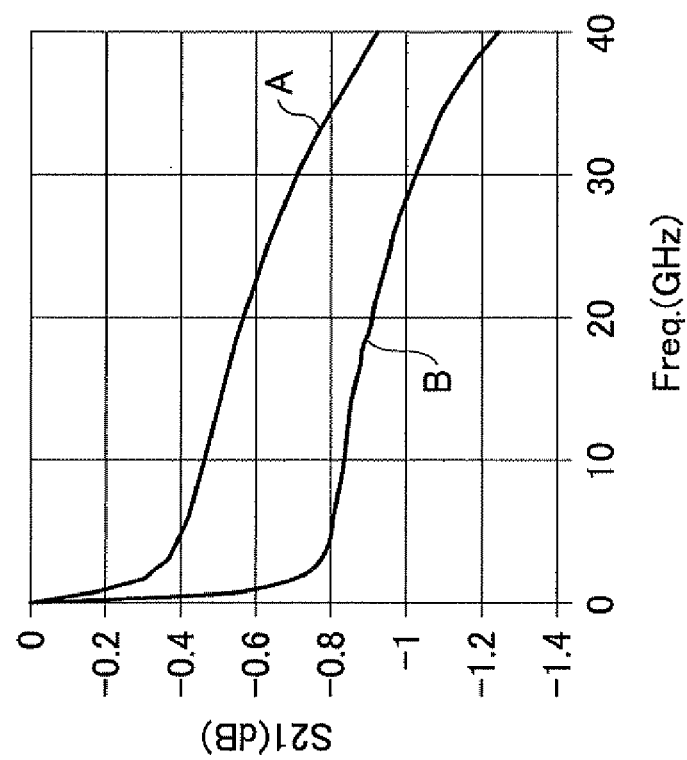
FIG. 17A is a graph indicating a result of S parameter simulation when a resistivity of the semiconductor substrate is set to 0.1 Ω·cm.
Figure 17B:
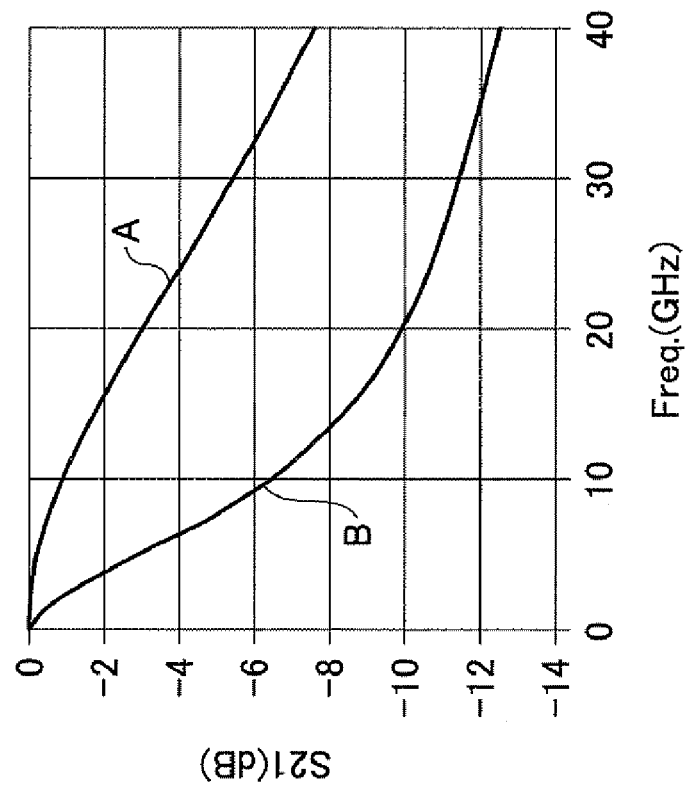
FIG. 17B is a graph indicating a result of S parameter simulation when a resistivity of the semiconductor substrate is set to 10 Ω·cm.

FIGS. 17A and 17B are graphs indicating results of S parameter simulation. FIG. 17A indicates a result of S parameter simulation when the resistivity of the semiconductor substrate was set to 0.1 Ω·cm. FIG. 17B indicates a result of S parameter simulation when the resistivity of the semiconductor substrate was set to 10 Ω·cm. In FIGS. 17A and 17B, A indicates the result of S parameter simulation of the sample A (L1=30 μm), and B indicates the result of S parameter simulation of the sample B (L1=0 μm).

As well-known in the art, the S parameter represents a transmission characteristic in a 4-terminal circuit network having an input terminal and an output terminal connected with lines having a characteristic impedance (for example, 50Ω), when a radio frequency signal is input. Here, a voltage penetration coefficient S21 represents a voltage transmitted to the output terminal when a voltage is input to the input terminal. The voltage penetration coefficient S21 indicates that the radio frequency characteristic becomes more excellent as a value of the voltage penetration coefficient S21 is closer to 0 dB (that is, as an amount of attenuation is smaller). As interpreted from the graphs of FIGS. 17A and 17B, it was found that the radio frequency characteristic of the sample A is superior to that of the sample B regardless of the resistivity of the semiconductor substrate 21.

Figure 18:
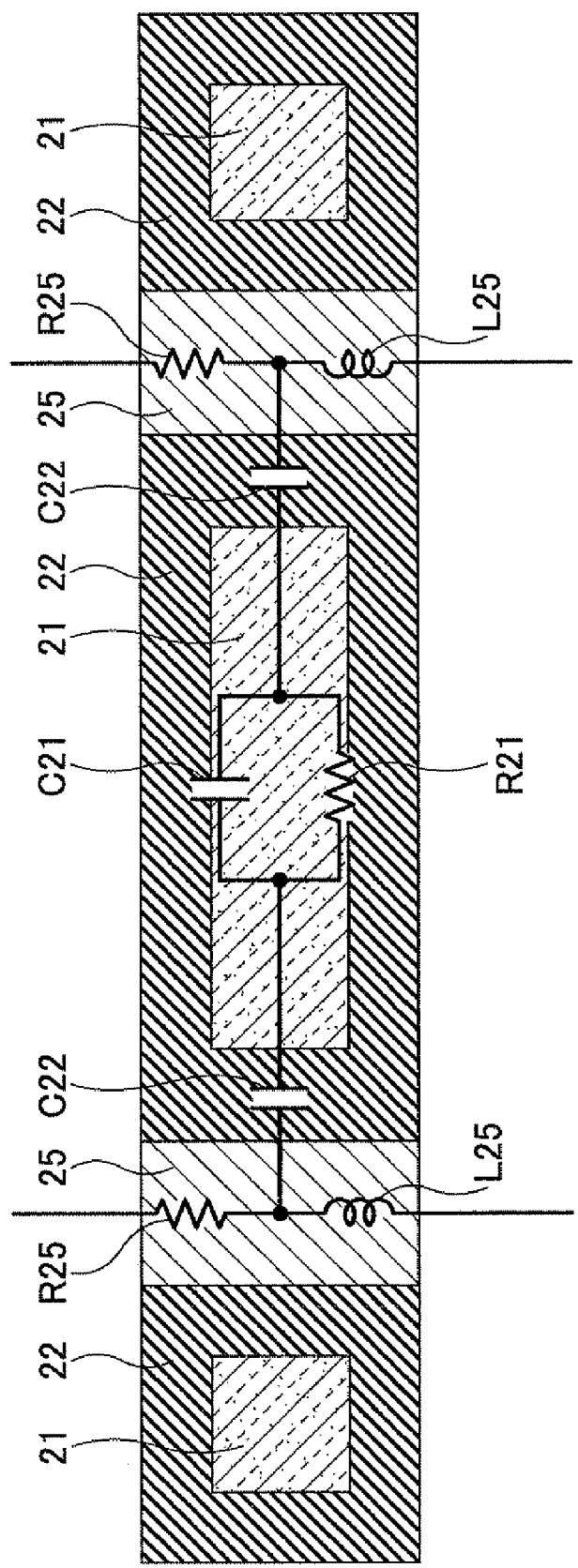
FIG. 18 is a view illustrating an equivalent circuit of the semiconductor package according to the first embodiment.

FIG. 18 is a view illustrating an equivalent circuit of the semiconductor package according to the first embodiment. In FIG. 18, parts that are the same as the parts illustrated in FIG. 2 are given the same reference numerals, and descriptions thereof will be omitted. As illustrated in FIG. 18, an equivalent circuit of the semiconductor package having the semiconductor substrate 21, the insulation film 22 and the penetration electrode 25 is represented by a circuit formed by a capacitance C21 and a resistance R21 of the semiconductor substrate 21, a capacitance C22 of the insulation film 22, and an inductance L25 and a resistance R25 of the penetration electrode 25.

The penetration electrode 25 and the semiconductor substrate 21 are electrically connected each other through the capacitance C22 of the insulation film 22, which results in deterioration of the radio frequency characteristic. In order to improve the radio frequency characteristic, it is better to reduce the capacitance C22 of the insulation film 22 by increasing the thickness of the insulation film 22. However, it is difficult to increase the capacitance C22 in practice because there is a limitation in increasing the thickness of the insulation film 22.

Instead of increasing the thickness of the insulation film 22, the cavity part 26 is provided between the penetration electrode 25 and the semiconductor substrate 21 in the first embodiment in order to reduce the capacitance C22 similar to the case in which the thickness of the insulation film 22 is increased. As a result, as illustrated in FIGS. 17A and 17B, the semiconductor package (sample A) according to the first embodiment, which has the cavity part 26, was superior in the radio frequency characteristic to the semiconductor package (sample B), which does not have the cavity part 26.

A description will be given below of a result of capacitance simulation.

Figure 19A:
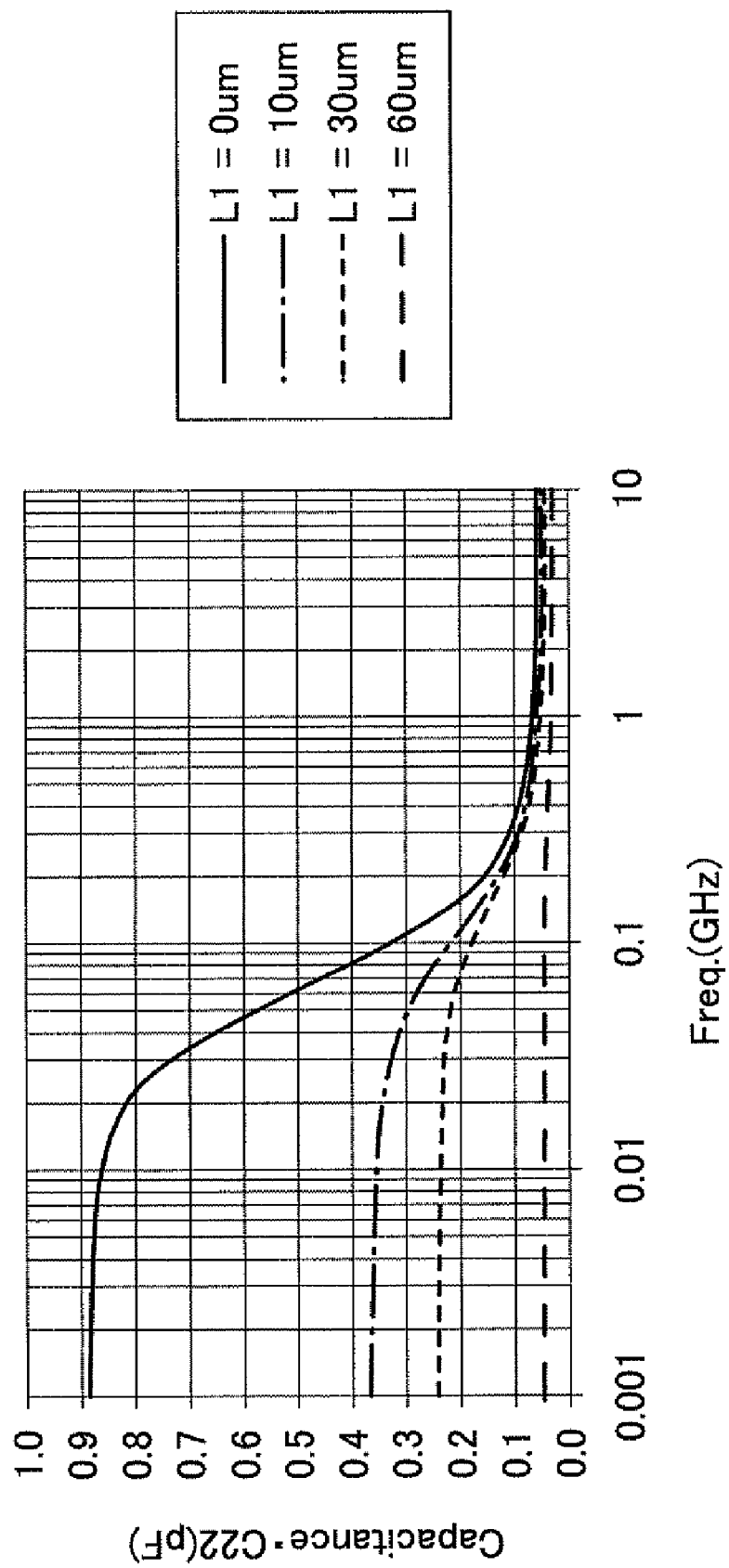
FIG. 19A is a graph indicating a result of capacitance simulation when a resistivity of the semiconductor substrate is set to 100 Ω·cm.
Figure 19B:
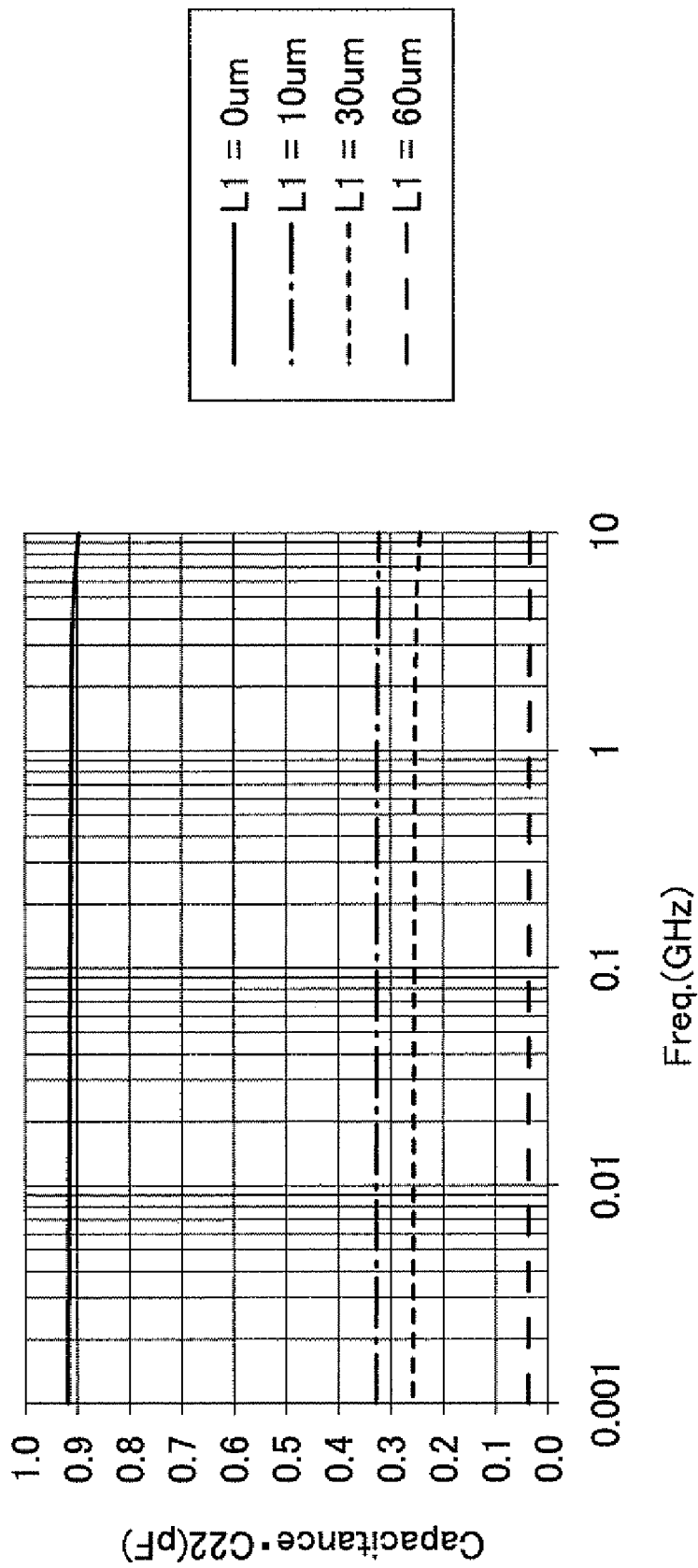
FIG. 19B is a graph indicating a result of capacitance simulation when a resistivity of the semiconductor substrate is set to 0.1 Ω·cm.

A capacitance simulation was performed on the semiconductor package according to the first embodiment with respect to the capacitance C22 (refer to FIG. 18) of the insulation film 22 by changing the width L1 illustrated in FIG. 16. FIGS. 19A and 19B are graphs indicating a result of the capacitance simulation. FIG. 19A indicates a result of capacitance simulation when the resistivity of the semiconductor substrate was set to 100 Ω·cm. FIG. 19B indicates a result of capacitance simulation when the resistivity of the semiconductor substrate was set to 0.1 Ω·cm. In FIGS. 19A and 19B, the width L1 illustrated in FIG. 16 is changed to 0 μm, 10 μm, 30 μm, 60 μm. The case where L1 is set to 0 μm means a state where the cavity part 26 is not formed.

As interpreted from the graphs of FIGS. 19A and 19B, the capacitance C22 of the insulation film 22 when the width L1 was set to 0 μm was smaller than that when the width L1 was set to 10 μm, 30 μm or 60 μm, and it was found that the case where the width L1 is set to 10 μm, 30 μm or 60 μm (cavity part 26 is formed) is superior in the radio frequency characteristic to the case where the width L1 is set to 0 μm (cavity part 26 is not formed). The capacitance C22 decreased as the width L1 was increased to 10 μm, 30 μm, and 60 μm. Thus, it was found that a larger width L1 provides a higher superiority in the radio frequency characteristic.

According to the semiconductor package 10 of the first embodiment, because the cavity part 26 is provided around the penetration electrode 25, the connection terminal 40, which connects the semiconductor device 20 to the wiring board 30, is slightly movable in the X-direction and the Y-direction. As a result, even if heat is applied to the semiconductor package 10, a stress generated in the joining part (vicinity of the connection terminal 40), due to a difference in thermal expansion coefficient between the semiconductor device 20 and the wiring board 30, can be relaxed greatly. Thus, the joining part (vicinity of the connection terminal 40) is prevented from generating a crack.

Moreover, because the connection terminal 40 is not directly formed on one end of the penetration electrode but formed on the metal layer 29 by way of the first wiring layer 23, the connection terminal 40 can be arranged at an arbitrary position without depending on the positions of the penetration electrode 25.

Further, the capacitance C22 of the insulation film 22 can be reduced by providing the cavity part 26 around the penetration electrode 25, thereby permitting an improvement in the radio frequency characteristic.

A description will be given of a first variation of the first embodiment.

Figure 20:
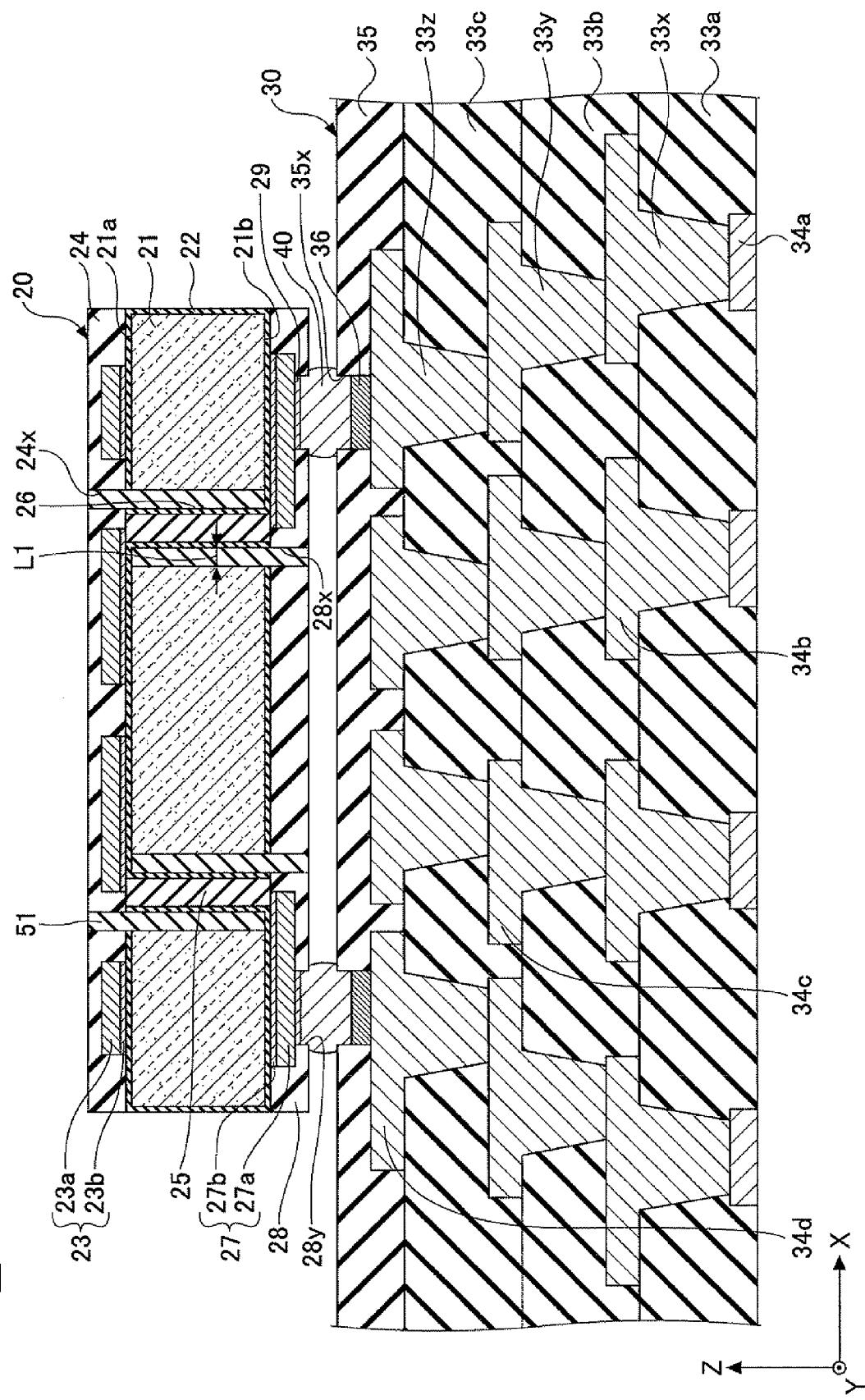
FIG. 20 is a cross-sectional view of a semiconductor package according to a first variation of the first embodiment.

FIG. 20 is a cross-sectional view of a semiconductor package according to a first variation of the first embodiment. In FIG. 20, parts that are the same as the part illustrated in FIG. 2 are given the same reference numerals, and descriptions thereof will be omitted. With reference to FIG. 20, a semiconductor package 50 according to the first variation of the first embodiment has the same structure as the semiconductor package 10 except that the cavity part 26 in the semiconductor package 10 according to the first embodiment is filled by a resin layer 51. The resin layer 51 may be formed using an epoxy resin, a polyimide resin, etc.

In the semiconductor package 50, the semiconductor device 20 is connected to the wiring board 30 electrically and mechanically through the connection terminal 40. Although the cavity part 26 is provided around the penetration electrode 25 and the cavity part 26 is filled by the resin layer 51, the connection terminal 40 is movable slightly in the X-direction and the Y-direction because the resin layer 51 has flexibility. Additionally, the penetration electrode 25 can be reinforced by filling the cavity part 26 with the resin layer 51.

Here, in a case where heat is applied to the semiconductor package 50, it is considered that a stress is generated in the joining part (vicinity of the connection terminal 40) because there is a difference in thermal expansion coefficient between the semiconductor device 20 and the wiring board 30. However, because the connection terminal 40 is movable slightly in the X-direction and the Y-direction, the stress generated in the joining part (vicinity of the connection terminal 40) can be relaxed greatly. Thus, the joining part (vicinity of the connection terminal 40) is prevented from generating a crack.

Although the semiconductor package 50 according to the first variation of the first embodiment can be manufactured by a process that is the same as the process illustrated in FIG. 4 through FIG. 15, it is necessary to perform a process of filling the cavity part 26 with the resin layer 51, which is an epoxy resin or the like, after the process illustrated in FIG. 12.

The semiconductor package 50 according to the first variation of the first embodiment provides the same effect as the semiconductor package 10 according to the first embodiment, and further provides the following effect. That is, the penetration electrode can be reinforced by filling the cavity part 26 with the resin layer 51.

A description will be given below of a second embodiment.

First, a description will be given of a structure of a semiconductor package according to the second embodiment. FIG. 21 is a cross-sectional view of the semiconductor package according to the second embodiment. In FIG. 21, parts that are the same as the parts illustrated in FIG. 2 are given the same reference numerals, and descriptions thereof will be omitted.

With reference to FIG. 21, the semiconductor package 70 according to the second embodiment includes a rewiring substrate 80 generally referred to as an interposer, a semiconductor device 90 and the wiring board 30. Hereinafter the rewiring substrate 80 is referred to as an interposer 80. The interposer 80 includes a substrate 81, an insulation film 82, a first electrode pad 83, a first insulation layer 84, the penetration electrode 25, the cavity part 26, a second electrode pad 87, a second insulation layer 88, a metal layer 89, and the connection terminal 40. As a material of the substrate 81, silicon, a resin (for example, an insulation resin), metal (for example, Cu), etc., can be used. A thickness of the substrate 81 can be set to, for example, about 200 μm. The substrate 81 can be in, for example, a 20 mm square shape.

The insulation film 82 is provided to cover a surface of the substrate 81 (except for an outer wall surface of the cavity part 26). The insulation film 82 is a film for insulating between the substrate 81 and the first electrode pad 83. For example, an oxide film (for example, a thermally oxidized film) can be used as the insulation film 82. If a thermally oxidized film is used as the insulation film 82, a thickness of the insulation film 82 can be set to about 1.5 μm. If an insulation resin is used as the material of the substrate 81, the insulation film 82 is not needed.

The first electrode pad 83 includes a first metal layer 83a and a second metal layer 83b, and is formed on one surface 81a of the substrate 81 by way of the insulation film 82. As a material of the first metal layer 83a, Cu or the like can be used. A thickness of the first metal layer 83a can be set to, for example, about 5 μm. As a material of the second metal layer 83b, Ti or the like can be used. A thickness of the second metal layer 83b can be set to, for example, about 100 nm.

The first insulation layer 84 is formed on the surface 81a of the substrate 81 by way of the insulation film 82 to cover the first electrode pad 83. The first insulation layer 84 has an aperture part 84x, which exposes a part of the cavity part 26, and an aperture part 84y, which exposes a part of the first electrode pad 83. As a material of the first insulation layer 84, a polyimide resin or the like can be used. A thickness of the first insulation layer 84 can be set to, for example, about 10 μm.

The substrate 81 is provided with the penetration electrode 25, which is an electrode penetrating the substrate 81 to extend from the surface 81a to the opposite surface 81b of the substrate 81. The penetration electrode 25 has been explained in detail above. The substrate 81 is provided with the cavity part 26 in order to expose the insulation film 82 formed on the side surface of the penetration electrode 25. The cavity part 26 has been explained in detail above.

The second electrode pad 87 includes a first metal layer 87a and a second metal layer 87b, and is formed on the surface 81b of the substrate 81 by way of the insulation film 82. As a material of the first metal layer 87a, Cu or the like can be used. A thickness of the first metal layer 87a can be set to, for example, about 5 μm. As a material of the second metal layer 87b, Ti or the like can be used. A thickness of the second metal layer 87b can be set to, for example, about 100 nm.

The second insulation layer 88 is formed on the surface 81b of the substrate 81 by way of the insulation film 82 to cover the second electrode pad 87. The second insulation layer 88 has an aperture part 88x, which exposes a part of the cavity part 26, and an aperture part 88y, which exposes a part of the second electrode pad 87. As a material of the second insulation layer 88, a polyimide resin or the like can be used. A thickness of the second insulation layer 88 can be set to, for example, about 10 μm.

The metal layer 89 is formed on the second electrode pad 87 exposed in the aperture part 88y. For example, Au can be used to form the metal layer 89. As a material of the metal layer 89, a Ni/Au layer may be used in which Ni and Au are laminated in that order on the second electrode pad 87, or a Ni/Pd/Au layer may be used in which Ni, Pd and Au are laminated in that order on the second electrode pas 87. Additionally, the metal layer 89 is not always formed. If a Ni/Pd/Au layer is used as the metal layer 89, a thickness of the Ni layer may be set to 1 μm, a thickness of the Pd layer may be 1 μm, and a thickness of the Au layer may be 0.05 μm.

The connection terminal 40 is formed on the metal layer 89 exposed in the aperture part 88y. The connection terminal 40 has been explained in detail before.

The semiconductor device 90 includes a semiconductor substrate 91, an electrode pad 92 and a connection terminal 93. A semiconductor integrated circuit (not illustrated in the figure) is formed on the semiconductor substrate 91. The semiconductor substrate 91 can be formed of, for example, silicon. A connection terminal 93, which serves as an electrode, is formed on the electrode pad 92. The connection terminal 93 is electrically connected to the first electrode pad 83 exposed in the aperture part 84y of the interposer 80. A solder ball, an Au bump, a conductive paste, etc., may be used as the connection terminal 93. If a solder ball is used as the connection terminal 93, a material of the connection terminal 93 may be an alloy containing Pb, an alloy of Sn and Bi, an alloy of Sn and Cu, an alloy of Sn and Ag, an alloy of Sn, Ag and Cu, etc.

As mentioned above, the connection terminal 93 of the semiconductor device 90 is connected electrically and mechanically to the metal layer 36 of the wiring board 30 through the first electrode pad 83, the penetration electrode 25, the second electrode pad 87 and the connection terminal 40 of the interposer 80. Because the cavity part 26 is provided around the penetration electrode 25, the connection terminal 40 is slightly movable in the X-direction and the Y-direction.

Here, considering a case where heat is applied to the semiconductor package 70, it is considered that a stress is generated in the joining part (the connection terminal 93, the first electrode pad 83, the penetration electrode 25, the second electrode pad 87, and the connection terminal 40) because there is a difference in thermal expansion coefficient between the semiconductor device 90 and the wiring board 30 as explained above. However, because the connection terminal 40 is slightly movable in the X-direction and the Y-direction, a stress generated in the joining part (the connection terminal 93, the first electrode pad 83, the penetration electrode 25, the second electrode pad 87, and the connection terminal 40) can be greatly relaxed. Therefore, generation of a crack in the joining part is prevented.

The interposer 80 included in the semiconductor package 70 according to the second embodiment can be manufactured by a method the same as the manufacturing method of the semiconductor device 20 of the first embodiment mentioned above.

As mentioned above, in the semiconductor package 70 according to the second embodiment, the penetration electrode 25 and the connection terminal 40 are provided in the interposer 80 in order to connect the semiconductor device 90 to the wiring board 30 through the penetration electrode 25 and the connection terminal 40 of the interposer 80. Because the cavity part 26 is provided around the penetration electrode 25, the connection terminal 40 is slightly movable in the X-direction and the Y-direction. As a result, even when heat is applied to the semiconductor package 70, a stress generated in the joining part (the connection terminal 93, the first electrode pad 83, the penetration electrode 25, the second electrode pad 87, and the connection terminal 40) can be greatly relaxed. Therefore, generation of a crack in the joining part (the connection terminal 93, the first electrode pad 83, the penetration electrode 25, the second electrode pad 87, and the connection terminal 40) is prevented.

The second embodiment is effective particularly in a case where it is difficult to form the penetration electrode 25 in the semiconductor device 90.

The present invention is not limited to the specifically disclosed embodiments. For example, in the first embodiment, a projection part may be provided to the penetration electrode 25 so that the connection terminal 40 is formed on the projection part.

Moreover, the wiring board included in the semiconductor package according to the first or second embodiment is not limited to a wiring board containing a build-up wiring layer having no core part as mentioned in the first embodiment. That is, the wiring board can be one of various types of wiring boards such as, for example, a single side (single layer) wiring board in which a wiring layer is formed on only one side of the substrate, a both side (dual layer) wiring board in which a wiring layer is formed on both sides of the substrate, a penetration multi-layer wiring board in which each wiring layer is connected by a through via, a wiring board containing a built-up wiring layer having a core part, and an IVH multi-layer wiring board in which a specific wiring layer is connected by interstitial via hole (IVH).

Furthermore, a variation of the second embodiment may be made in the same manner as the variation of the first embodiment.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention (s) has (have) been described in detail, it should be understood that the various changes, substitutions, and alterations could be made hereto without departing from the spirit and scope of the invention.

What is claimed is:
1. A semiconductor package comprising:
a wiring board; and
a semiconductor device mounted on said wiring board,
wherein said semiconductor device includes:
a semiconductor substrate;
a penetration electrode penetrating said semiconductor substrate;
a cavity part formed in said semiconductor substrate to surround and isolate said penetration electrode from said semiconductor substrate;

a first wiring formed on a front surface of said semiconductor substrate, the first wiring extending over said cavity part and connected to said penetration electrode; and a second wiring formed on a back surface of said semiconductor substrate, the second wiring extending over said cavity part and connected to said penetration electrode, wherein, in a plan view of said semiconductor substrate, said first wiring and said second wiring do not overlap each other in a portion corresponding to said cavity part.

2. The semiconductor package as claimed in claim 1, wherein said cavity part is filled with a resin.

3. The semiconductor package as claimed in claim 1, wherein an insulation film is formed on a side surface of said penetration electrode, the side surface of said penetration electrode being exposed by said cavity part.

4. The semiconductor package as claimed in claim 3, wherein said cavity part is filled with a resin.

5. A semiconductor package comprising:
a wiring board;
a rewiring substrate; and
a semiconductor device mounted on said wiring board by way of said rewiring substrate,
wherein said rewiring substrate includes:
a substrate;
a penetration electrode penetrating said substrate;
a cavity part formed in said substrate to isolate said penetration electrode from said substrate;
a first wiring formed on a front surface of said semiconductor substrate, the first wiring extending over said cavity part and connected to said penetration electrode; and
a second wiring formed on a back surface of said semiconductor substrate, the second wiring extending over said cavity part and connected to said penetration electrode,
wherein, in a plan view of said semiconductor substrate, said first wiring and said second wiring do not overlap each other in a portion corresponding to said cavity part.

6. The semiconductor package as claimed in claim 5, wherein said cavity part is filled with a resin.

7. The semiconductor package as claimed in claim 5, wherein an insulation film is formed on a side surface of said penetration electrode, the side surface of said penetration electrode being exposed by said cavity part.

8. The semiconductor package as claimed in claim 7, wherein said cavity part is filled with a resin.

* * * * *